(12) United States Patent
Nguyen et al.

(10) Patent No.: US 7,794,544 B2
(45) Date of Patent: Sep. 14, 2010

(54) CONTROL OF GAS FLOW AND DELIVERY TO SUPPRESS THE FORMATION OF PARTICLES IN AN MOCVD/ALD SYSTEM

(75) Inventors: Son T. Nguyen, San Jose, CA (US); Kedarnath Sangam, Sunnyvale, CA (US); Miriam Schwartz, Los Gatos, CA (US); Kenric Choi, Santa Clara, CA (US); Sanjay Bhat, Bangalore (IN); Pravin K. Narwankar, Sunnyvale, CA (US); Shreyas Kher, Campbell, CA (US); Rahul Sharangapani, Fremont, CA (US); Shankar Muthukrishnan, San Jose, CA (US); Paul Deaton, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/925,684

(22) Filed: Oct. 26, 2007

(65) Prior Publication Data
US 2008/0041307 A1    Feb. 21, 2008

Related U.S. Application Data

(62) Division of application No. 11/119,388, filed on Apr. 29, 2005, now abandoned.

(60) Provisional application No. 60/570,173, filed on May 12, 2004.

(51) Int. Cl.
C23C 16/00 (2006.01)
E03B 1/00 (2006.01)
F17D 1/00 (2006.01)
F15C 1/16 (2006.01)

(52) U.S. Cl. ............................. 118/715; 137/8; 137/808

(58) Field of Classification Search .................... 137/8, 137/808
See application file for complete search history.

(56) References Cited

U.S. PATENT DOCUMENTS 4,058,430 A    11/1977    Suntola et al.

(Continued)

FOREIGN PATENT DOCUMENTS

EP          0464515         1/1992

(Continued)

OTHER PUBLICATIONS

Machine translation: Sakai et al., JP 2004-134466; Apr. 30, 2004.*

(Continued)

*Primary Examiner*—Michael Cleveland
*Assistant Examiner*—Nathan K Ford
(74) *Attorney, Agent, or Firm*—Patterson & Sheridan, LLP

(57) ABSTRACT

The embodiments of the invention describe a process chamber, such as an ALD chamber, that has gas delivery conduits with gradually increasing diameters to reduce Joule-Thompson effect during gas delivery, a ring-shaped gas liner leveled with the substrate support to sustain gas temperature and to reduce gas flow to the substrate support backside, and a gas reservoir to allow controlled delivery of process gas. The gas conduits with gradually increasing diameters, the ring-shaped gas liner, and the gas reservoir help keep the gas temperature stable and reduce the creation of particles.

14 Claims, 12 Drawing Sheets

U.S. PATENT DOCUMENTS

| | | | |
|---|---|---|---|
| 4,247,520 A * | | 1/1981 | Worner .................. 422/176 |
| 4,389,973 A | | 6/1983 | Suntola et al. |
| 4,413,022 A | | 11/1983 | Suntola et al. |
| 4,415,275 A | | 11/1983 | Dietrich |
| 4,480,435 A * | | 11/1984 | Anahara et al. ............ 57/333 |
| 4,486,487 A | | 12/1984 | Skarp et al. |
| 4,693,208 A | | 9/1987 | Sakai et al. |
| 4,761,269 A | | 8/1988 | Conger et al. |
| 4,825,809 A | | 5/1989 | Mieno et al. |
| 4,834,831 A | | 5/1989 | Nishizawa et al. |
| 4,947,790 A | | 8/1990 | Gartner et al. |
| 4,975,252 A | | 12/1990 | Nishizawa et al. |
| 4,993,357 A | | 2/1991 | Scholz et al. |
| 5,027,746 A | | 7/1991 | Frijlink et al. |
| 5,173,327 A | | 12/1992 | Sandhu et al. |
| 5,178,681 A | | 1/1993 | Moore et al. |
| 5,224,202 A | | 6/1993 | Arnold et al. |
| 5,225,366 A | | 7/1993 | Yoder |
| 5,229,081 A | | 7/1993 | Suda |
| 5,261,959 A | | 11/1993 | Gasworth |
| 5,281,274 A | | 1/1994 | Yoder |
| 5,290,609 A | | 3/1994 | Horiike et al. |
| 5,294,262 A * | | 3/1994 | Nishimura ............... 134/22.1 |
| 5,294,286 A | | 3/1994 | Nishizawa et al. |
| 5,306,666 A | | 4/1994 | Izumi et al. |
| 5,338,362 A | | 8/1994 | Imahashi et al. |
| 5,374,570 A | | 12/1994 | Nasu et al. |
| 5,441,703 A | | 8/1995 | Jurgensen et al. |
| 5,443,647 A | | 8/1995 | Aucoin et al. |
| 5,480,818 A | | 1/1996 | Matsumoto et al. |
| 5,483,919 A | | 1/1996 | Yokoyama et al. |
| 5,503,875 A | | 4/1996 | Imai et al. |
| 5,521,126 A | | 5/1996 | Okamura et al. |
| 5,526,244 A | | 6/1996 | Bishop |
| 5,558,717 A | | 9/1996 | Zhao et al. |
| 5,580,421 A | | 12/1996 | Hiatt et al. |
| 5,674,786 A | | 10/1997 | Turner et al. |
| 5,711,811 A | | 1/1998 | Suntola et al. |
| 5,730,802 A | | 3/1998 | Ishizumi et al. |
| 5,796,116 A | | 8/1998 | Nakata et al. |
| 5,807,792 A | | 9/1998 | Ilg et al. |
| 5,820,678 A * | | 10/1998 | Hubert et al. ............. 118/690 |
| 5,834,372 A | | 11/1998 | Lee et al. |
| 5,835,677 A | | 11/1998 | Li et al. |
| 5,846,332 A | | 12/1998 | Zhao et al. |
| 5,855,680 A | | 1/1999 | Soininen et al. |
| 5,879,459 A | | 3/1999 | Gadgil et al. |
| 5,882,411 A | | 3/1999 | Zhao et al. |
| 5,906,683 A | | 5/1999 | Chen et al. |
| 5,916,365 A | | 6/1999 | Sherman |
| 5,923,056 A | | 7/1999 | Lee et al. |
| 5,972,430 A | | 10/1999 | DiMeo, Jr. et al. |
| 5,989,345 A | | 11/1999 | Hatano et al. |
| 6,001,267 A | | 12/1999 | Os et al. |
| 6,001,420 A | | 12/1999 | Mosely et al. |
| 6,013,553 A | | 1/2000 | Wallace et al. |
| 6,015,590 A | | 1/2000 | Suntola et al. |
| 6,015,917 A | | 1/2000 | Bhandari et al. |
| 6,020,243 A | | 2/2000 | Wallace et al. |
| 6,025,627 A | | 2/2000 | Forbes et al. |
| 6,042,652 A | | 3/2000 | Hyun et al. |
| 6,043,177 A | | 3/2000 | Falconer et al. |
| 6,060,755 A | | 5/2000 | Ma et al. |
| 6,071,572 A | | 6/2000 | Mosely et al. |
| 6,079,356 A | | 6/2000 | Umotoy et al. |
| 6,084,302 A | | 7/2000 | Sandhu |
| 6,099,904 A | | 8/2000 | Mak et al. |
| 6,124,158 A | | 9/2000 | Dautartas et al. |
| 6,139,700 A | | 10/2000 | Kang et al. |
| 6,143,077 A | | 11/2000 | Ikeda et al. |
| 6,143,082 A | | 11/2000 | McInerney et al. |
| 6,143,659 A | | 11/2000 | Leem et al. |
| 6,144,060 A | | 11/2000 | Park et al. |
| 6,156,382 A | | 12/2000 | Rajagopalan et al. |
| 6,162,715 A | | 12/2000 | Mak et al. |
| 6,174,377 B1 | | 1/2001 | Doering et al. |
| 6,174,809 B1 | | 1/2001 | Kang et al. |
| 6,183,563 B1 | | 2/2001 | Choi et al. |
| 6,197,683 B1 | | 3/2001 | Kang et al. |
| 6,200,893 B1 | | 3/2001 | Sneh |
| 6,203,613 B1 | | 3/2001 | Gates et al. |
| 6,206,967 B1 | | 3/2001 | Mak et al. |
| 6,207,302 B1 | | 3/2001 | Sugiura et al. |
| 6,207,487 B1 | | 3/2001 | Kim et al. |
| 6,231,672 B1 | | 5/2001 | Choi et al. |
| 6,238,734 B1 | | 5/2001 | Senzaki et al. |
| 6,251,190 B1 | | 6/2001 | Mak et al. |
| 6,270,572 B1 | | 8/2001 | Kim et al. |
| 6,270,839 B1 | | 8/2001 | Onoe et al. |
| 6,284,646 B1 | | 9/2001 | Leem et al. |
| 6,287,965 B1 | | 9/2001 | Kang et al. |
| 6,291,283 B1 | | 9/2001 | Wilk |
| 6,291,867 B1 | | 9/2001 | Wallace et al. |
| 6,296,711 B1 | | 10/2001 | Loan et al. |
| 6,297,172 B1 | | 10/2001 | Kashiwagi et al. |
| 6,297,539 B1 | | 10/2001 | Ma et al. |
| 6,299,294 B1 | | 10/2001 | Regan |
| 6,302,965 B1 | | 10/2001 | Umotoy et al. |
| 6,305,314 B1 | | 10/2001 | Sneh et al. |
| 6,306,216 B1 | | 10/2001 | Kim et al. |
| 6,309,713 B1 | | 10/2001 | Mak et al. |
| 6,335,240 B1 | | 1/2002 | Kim et al. |
| 6,342,277 B1 | | 1/2002 | Sherman |
| 6,348,376 B2 | | 2/2002 | Lim et al. |
| 6,348,386 B1 | | 2/2002 | Gilmer |
| 6,358,829 B2 | | 3/2002 | Yoon et al. |
| 6,372,598 B2 | | 4/2002 | Kang et al. |
| 6,379,748 B1 | | 4/2002 | Bhandari et al. |
| 6,391,785 B1 | | 5/2002 | Satta et al. |
| 6,391,803 B1 | | 5/2002 | Kim et al. |
| 6,395,650 B1 | | 5/2002 | Callegari et al. |
| 6,399,208 B1 | | 6/2002 | Baum et al. |
| 6,399,491 B2 | | 6/2002 | Jeon et al. |
| 6,416,577 B1 | | 7/2002 | Suntoloa et al. |
| 6,416,822 B1 | | 7/2002 | Chiang et al. |
| 6,420,279 B1 | | 7/2002 | Ono et al. |
| 6,428,847 B1 | | 8/2002 | Grant et al. |
| 6,428,859 B1 | | 8/2002 | Chiang et al. |
| 6,433,314 B1 | | 8/2002 | Mandrekar et al. |
| 6,447,607 B2 | | 9/2002 | Soininen et al. |
| 6,451,119 B2 | | 9/2002 | Sneh et al. |
| 6,451,695 B2 | | 9/2002 | Sneh |
| 6,452,229 B1 | | 9/2002 | Krivokapic |
| 6,452,338 B1 | | 9/2002 | Horsky |
| 6,454,860 B2 | | 9/2002 | Metzner et al. |
| 6,458,701 B1 | | 10/2002 | Chae et al. |
| 6,462,367 B2 | | 10/2002 | Marsh et al. |
| 6,468,924 B2 | | 10/2002 | Lee et al. |
| 6,475,276 B1 | | 11/2002 | Elers et al. |
| 6,475,910 B1 | | 11/2002 | Sneh |
| 6,478,872 B1 | | 11/2002 | Chae et al. |
| 6,481,945 B1 | | 11/2002 | Hasper et al. |
| 6,482,262 B1 | | 11/2002 | Elers et al. |
| 6,482,733 B2 | | 11/2002 | Raaijmakers et al. |
| 6,489,214 B2 | | 12/2002 | Kim et al. |
| 6,492,283 B2 | | 12/2002 | Raaijmakers et al. |
| 6,498,091 B1 | | 12/2002 | Chen et al. |
| 6,511,539 B1 | | 1/2003 | Raaijmakers et al. |
| 6,520,218 B1 | | 2/2003 | Gregg et al. |
| 6,524,952 B1 | | 2/2003 | Srinivas et al. |
| 6,534,395 B2 | | 3/2003 | Werkhoven et al. |
| 6,548,112 B1 | | 4/2003 | Hillman et al. |
| 6,548,424 B2 | | 4/2003 | Putkonen et al. |
| 6,551,406 B2 | | 4/2003 | Kilpi et al. |

| | | | | | | |
|---|---|---|---|---|---|---|
| 6,551,929 B1 | 4/2003 | Kori et al. | | 6,915,592 B2 | 7/2005 | Guenther |
| 6,558,509 B2 | 5/2003 | Kraus et al. | | 6,916,398 B2 | 7/2005 | Chen et al. |
| 6,561,498 B2 | 5/2003 | Tompkins et al. | | 6,921,062 B2 | 7/2005 | Gregg et al. |
| 6,569,501 B2 | 5/2003 | Chiang et al. | | 6,924,191 B2 | 8/2005 | Liu et al. |
| 6,572,705 B1 | 6/2003 | Suntola et al. | | 6,930,060 B2 | 8/2005 | Chou et al. |
| 6,578,287 B2 | 6/2003 | Aswad | | 6,932,871 B2 | 8/2005 | Chang et al. |
| 6,579,372 B2 | 6/2003 | Park | | 6,936,906 B2 | 8/2005 | Chung et al. |
| 6,585,823 B1 | 7/2003 | Van Wijck et al. | | 6,939,801 B2 | 9/2005 | Chung et al. |
| 6,593,484 B2 | 7/2003 | Yasuhara et al. | | 6,946,033 B2 | 9/2005 | Tsuei et al. |
| 6,596,602 B2 | 7/2003 | Iizuka et al. | | 6,951,804 B2 | 10/2005 | Seutter et al. |
| 6,596,643 B2 | 7/2003 | Chen et al. | | 6,953,742 B2 | 10/2005 | Chen et al. |
| 6,599,572 B2 | 7/2003 | Saanila et al. | | 6,955,211 B2 | 10/2005 | Ku et al. |
| 6,607,973 B1 | 8/2003 | Jeon | | 6,958,296 B2 | 10/2005 | Chen et al. |
| 6,607,976 B2 | 8/2003 | Chen et al. | | 6,969,539 B2 | 11/2005 | Gordon et al. |
| 6,613,383 B1 | 9/2003 | George et al. | | 6,972,267 B2 | 12/2005 | Cao et al. |
| 6,620,670 B2 | 9/2003 | Song et al. | | 6,974,771 B2 | 12/2005 | Chen et al. |
| 6,620,723 B1 | 9/2003 | Byun et al. | | 6,983,892 B2 | 1/2006 | Noorbakhsh et al. |
| 6,630,030 B1 | 10/2003 | Suntola et al. | | 6,994,319 B2 | 2/2006 | Yudovsky |
| 6,630,201 B2 | 10/2003 | Chiang et al. | | 6,998,014 B2 | 2/2006 | Chen et al. |
| 6,630,413 B2 | 10/2003 | Todd | | 7,026,238 B2 | 4/2006 | Xi et al. |
| 6,632,279 B1 | 10/2003 | Ritala et al. | | 7,041,335 B2 | 5/2006 | Chung |
| 6,632,747 B2 | 10/2003 | Niimi et al. | | 7,049,226 B2 | 5/2006 | Chung et al. |
| 6,660,126 B2 | 12/2003 | Nguyen et al. | | 7,066,194 B2 | 6/2006 | Ku et al. |
| 6,660,622 B2 | 12/2003 | Chen et al. | | 7,067,439 B2 | 6/2006 | Metzner et al. |
| 6,660,659 B1 | 12/2003 | Kraus et al. | | 7,081,271 B2 | 7/2006 | Chung et al. |
| 6,660,660 B2 | 12/2003 | Haukka et al. | | 7,085,616 B2 | 8/2006 | Chin et al. |
| 6,674,138 B1 | 1/2004 | Halliyal et al. | | 7,094,680 B2 | 8/2006 | Seutter et al. |
| 6,677,247 B2 | 1/2004 | Yuan et al. | | 7,094,685 B2 | 8/2006 | Yang et al. |
| 6,686,271 B2 | 2/2004 | Raaijmakers et al. | | 7,175,713 B2 | 2/2007 | Thakur et al. |
| 6,713,177 B2 | 3/2004 | George et al. | | 7,186,385 B2 | 3/2007 | Ganguli et al. |
| 6,713,846 B1 | 3/2004 | Senzaki | | 7,201,803 B2 | 4/2007 | Lu et al. |
| 6,716,287 B1 | 4/2004 | Santiago et al. | | 7,204,886 B2 | 4/2007 | Chen et al. |
| 6,718,126 B2 | 4/2004 | Lei | | 7,208,413 B2 | 4/2007 | Byun et al. |
| 6,720,027 B2 | 4/2004 | Yang et al. | | 7,211,508 B2 | 5/2007 | Chung et al. |
| 6,734,020 B2 | 5/2004 | Lu et al. | | 7,222,636 B2 | 5/2007 | Nguyen et al. |
| 6,740,585 B2 | 5/2004 | Yoon et al. | | 7,228,873 B2 | 6/2007 | Ku et al. |
| 6,772,072 B2 | 8/2004 | Ganguli et al. | | 7,270,709 B2 | 9/2007 | Chen et al. |
| 6,773,507 B2 | 8/2004 | Jallepally et al. | | 7,294,208 B2 | 11/2007 | Guenther |
| 6,777,352 B2 | 8/2004 | Tepman et al. | | 7,402,210 B2 | 7/2008 | Chen et al. |
| 6,778,762 B1 | 8/2004 | Shareef et al. | | 7,408,225 B2 | 8/2008 | Shinriki et al. |
| 6,784,096 B2 | 8/2004 | Chen et al. | | 2001/0000866 A1 | 5/2001 | Sneh et al. |
| 6,790,773 B1 | 9/2004 | Drewery et al. | | 2001/0002280 A1 | 5/2001 | Sneh |
| 6,797,108 B2 | 9/2004 | Wendling | | 2001/0009140 A1 | 7/2001 | Bondestam et al. |
| 6,800,173 B2 | 10/2004 | Chiang et al. | | 2001/0009695 A1 | 7/2001 | Saanila et al. |
| 6,803,272 B1 | 10/2004 | Halliyal et al. | | 2001/0011526 A1 | 8/2001 | Doering et al. |
| 6,815,285 B2 | 11/2004 | Choi et al. | | 2001/0013312 A1 | 8/2001 | Soininen et al. |
| 6,818,094 B2 | 11/2004 | Yudovsky | | 2001/0014371 A1 | 8/2001 | Kilpi |
| 6,818,250 B2 | 11/2004 | George et al. | | 2001/0021589 A1 | 9/2001 | Wilk |
| 6,821,563 B2 | 11/2004 | Yudovsky | | 2001/0024387 A1 | 9/2001 | Raaijmakers et al. |
| 6,825,134 B2 | 11/2004 | Law et al. | | 2001/0024871 A1 | 9/2001 | Yagi |
| 6,827,815 B2 | 12/2004 | Hytros et al. | | 2001/0025979 A1 | 10/2001 | Kim et al. |
| 6,831,004 B2 | 12/2004 | Byun et al. | | 2001/0028924 A1 | 10/2001 | Sherman |
| 6,831,021 B2 | 12/2004 | Chua et al. | | 2001/0029092 A1 | 10/2001 | Park et al. |
| 6,838,125 B2 | 1/2005 | Chung et al. | | 2001/0029891 A1 | 10/2001 | Oh et al. |
| 6,841,200 B2 | 1/2005 | Kraus et al. | | 2001/0034123 A1 | 10/2001 | Jeon et al. |
| 6,846,516 B2 | 1/2005 | Yang et al. | | 2001/0041250 A1 | 11/2001 | Werkhoven et al. |
| 6,849,545 B2 | 2/2005 | Mak et al. | | 2001/0042523 A1 | 11/2001 | Kesala |
| 6,858,547 B2 | 2/2005 | Metzner et al. | | 2001/0042799 A1 | 11/2001 | Kim et al. |
| 6,861,356 B2 | 3/2005 | Matsuse et al. | | 2001/0050039 A1 | 12/2001 | Park |
| 6,866,746 B2 | 3/2005 | Lei et al. | | 2001/0054377 A1 | 12/2001 | Lindfors et al. |
| 6,868,859 B2 | 3/2005 | Yudovsky | | 2001/0054730 A1 | 12/2001 | Kim et al. |
| 6,869,838 B2 | 3/2005 | Law et al. | | 2001/0054769 A1 | 12/2001 | Raaijmakers et al. |
| 6,875,271 B2 | 4/2005 | Glenn et al. | | 2002/0000196 A1 | 1/2002 | Park |
| 6,878,206 B2 | 4/2005 | Tzu et al. | | 2002/0000598 A1 | 1/2002 | Kang et al. |
| 6,881,437 B2 | 4/2005 | Ivanov et al. | | 2002/0005168 A1 | 1/2002 | Kraus et al. |
| 6,893,915 B2 | 5/2005 | Park et al. | | 2002/0005556 A1 | 1/2002 | Cartier et al. |
| 6,897,106 B2 | 5/2005 | Park et al. | | 2002/0007790 A1 | 1/2002 | Park |
| 6,902,624 B2 | 6/2005 | Seidel et al. | | 2002/0008297 A1 | 1/2002 | Park et al. |
| 6,905,541 B2 | 6/2005 | Chen et al. | | 2002/0009544 A1 | 1/2002 | Mcfeely et al. |
| 6,905,737 B2 | 6/2005 | Verplancken et al. | | 2002/0009896 A1 | 1/2002 | Sandhu et al. |
| 6,911,093 B2 | 6/2005 | Stacey et al. | | 2002/0014647 A1 | 2/2002 | Seidl et al. |
| 6,911,391 B2 | 6/2005 | Yang et al. | | 2002/0015790 A1 | 2/2002 | Baum et al. |
| 6,913,827 B2 | 7/2005 | George et al. | | 2002/0016084 A1 | 2/2002 | Todd |

| | | | | | | |
|---|---|---|---|---|---|---|
| 2002/0017242 A1 | 2/2002 | Hamaguchi et al. | | 2003/0013320 A1 | 1/2003 | Kim et al. |
| 2002/0020869 A1 | 2/2002 | Park et al. | | 2003/0015764 A1 | 1/2003 | Raaijmakers et al. |
| 2002/0021544 A1 | 2/2002 | Cho et al. | | 2003/0017697 A1 | 1/2003 | Choi et al. |
| 2002/0029092 A1 | 3/2002 | Gass | | 2003/0022338 A1 | 1/2003 | Ruben et al. |
| 2002/0031618 A1 | 3/2002 | Sherman | | 2003/0022487 A1 | 1/2003 | Yoon et al. |
| 2002/0041931 A1 | 4/2002 | Suntola et al. | | 2003/0022507 A1 | 1/2003 | Chen et al. |
| 2002/0043666 A1 | 4/2002 | Parsons et al. | | 2003/0023338 A1 | 1/2003 | Chin et al. |
| 2002/0047151 A1 | 4/2002 | Kim et al. | | 2003/0029715 A1 | 2/2003 | Yu et al. |
| 2002/0048635 A1 | 4/2002 | Kim et al. | | 2003/0031807 A1 | 2/2003 | Elers et al. |
| 2002/0052097 A1 | 5/2002 | Park | | 2003/0032281 A1 | 2/2003 | Werkhoven et al. |
| 2002/0060363 A1 | 5/2002 | Xi et al. | | 2003/0038369 A1 | 2/2003 | Layadi et al. |
| 2002/0064970 A1 | 5/2002 | Chooi et al. | | 2003/0042630 A1 | 3/2003 | Babcoke et al. |
| 2002/0066411 A1 | 6/2002 | Chiang et al. | | 2003/0049931 A1 | 3/2003 | Byun et al. |
| 2002/0068458 A1 | 6/2002 | Chiang et al. | | 2003/0049942 A1 | 3/2003 | Haukka et al. |
| 2002/0073924 A1 | 6/2002 | Chiang et al. | | 2003/0053799 A1 | 3/2003 | Lei |
| 2002/0074588 A1 | 6/2002 | Lee | | 2003/0054631 A1 | 3/2003 | Raaijmakers et al. |
| 2002/0076481 A1 | 6/2002 | Chiang et al. | | 2003/0057526 A1 | 3/2003 | Chung et al. |
| 2002/0076507 A1 | 6/2002 | Chiang et al. | | 2003/0057527 A1 | 3/2003 | Chung et al. |
| 2002/0076508 A1 | 6/2002 | Chiang et al. | | 2003/0059535 A1 | 3/2003 | Luo et al. |
| 2002/0076837 A1 | 6/2002 | Hujanen et al. | | 2003/0059538 A1 | 3/2003 | Chung et al. |
| 2002/0081826 A1 | 6/2002 | Rotondaro et al. | | 2003/0060057 A1 | 3/2003 | Raaijmakers et al. |
| 2002/0081844 A1 | 6/2002 | Jeon et al. | | 2003/0068437 A1 | 4/2003 | Nakamura et al. |
| 2002/0086106 A1 | 7/2002 | Park et al. | | 2003/0072884 A1 | 4/2003 | Zhang et al. |
| 2002/0086111 A1 | 7/2002 | Byun et al. | | 2003/0072913 A1 | 4/2003 | Chou et al. |
| 2002/0086507 A1 | 7/2002 | Park et al. | | 2003/0072975 A1 | 4/2003 | Shero et al. |
| 2002/0092471 A1 | 7/2002 | Kang et al. | | 2003/0075273 A1 | 4/2003 | Kilpela et al. |
| 2002/0093046 A1 | 7/2002 | Moriya et al. | | 2003/0075925 A1 | 4/2003 | Lindfors et al. |
| 2002/0093781 A1 | 7/2002 | Bachhofer et al. | | 2003/0079686 A1* | 5/2003 | Chen et al. .................. 118/715 |
| 2002/0094689 A1 | 7/2002 | Park | | 2003/0082296 A1 | 5/2003 | Elers et al. |
| 2002/0098627 A1 | 7/2002 | Pomarede et al. | | 2003/0082300 A1 | 5/2003 | Todd et al. |
| 2002/0104481 A1 | 8/2002 | Chiang et al. | | 2003/0082301 A1 | 5/2003 | Chen et al. |
| 2002/0106451 A1 | 8/2002 | Skarp et al. | | 2003/0082307 A1 | 5/2003 | Chung et al. |
| 2002/0106536 A1 | 8/2002 | Lee et al. | | 2003/0087520 A1 | 5/2003 | Chen et al. |
| 2002/0106846 A1 | 8/2002 | Seutter et al. | | 2003/0089308 A1 | 5/2003 | Raaijmakers |
| 2002/0108570 A1 | 8/2002 | Lindfors | | 2003/0089942 A1 | 5/2003 | Bhattacharyya |
| 2002/0110991 A1 | 8/2002 | Li | | 2003/0096473 A1 | 5/2003 | Shih et al. |
| 2002/0115252 A1 | 8/2002 | Haukka et al. | | 2003/0101927 A1 | 6/2003 | Raaijmakers |
| 2002/0115886 A1 | 8/2002 | Yasuhara et al. | | 2003/0101938 A1 | 6/2003 | Ronsse et al. |
| 2002/0117399 A1 | 8/2002 | Chen et al. | | 2003/0104707 A1 | 6/2003 | Senzaki et al. |
| 2002/0121241 A1 | 9/2002 | Nguyen et al. | | 2003/0104710 A1 | 6/2003 | Visokay et al. |
| 2002/0121342 A1 | 9/2002 | Nguyen et al. | | 2003/0106490 A1 | 6/2003 | Jallepally et al. |
| 2002/0127745 A1 | 9/2002 | Lu et al. | | 2003/0108674 A1 | 6/2003 | Chung et al. |
| 2002/0134307 A1 | 9/2002 | Choi | | 2003/0109114 A1 | 6/2003 | Niwa |
| 2002/0135071 A1 | 9/2002 | Kang et al. | | 2003/0113187 A1 | 6/2003 | Lei et al. |
| 2002/0144655 A1 | 10/2002 | Chiang et al. | | 2003/0116087 A1 | 6/2003 | Nguyen et al. |
| 2002/0144657 A1 | 10/2002 | Chiang et al. | | 2003/0116804 A1 | 6/2003 | Visokay et al. |
| 2002/0145210 A1 | 10/2002 | Tompkins et al. | | 2003/0121469 A1 | 7/2003 | Lindfors et al. |
| 2002/0146511 A1 | 10/2002 | Chiang et al. | | 2003/0121608 A1 | 7/2003 | Chen et al. |
| 2002/0146895 A1 | 10/2002 | Ramdani et al. | | 2003/0124262 A1 | 7/2003 | Chen et al. |
| 2002/0151152 A1 | 10/2002 | Shimamoto et al. | | 2003/0127427 A1 | 7/2003 | Yuan et al. |
| 2002/0153579 A1 | 10/2002 | Yamamoto | | 2003/0129826 A1 | 7/2003 | Werkhoven et al. |
| 2002/0155722 A1 | 10/2002 | Satta et al. | | 2003/0133861 A1 | 7/2003 | Bowen et al. |
| 2002/0162506 A1 | 11/2002 | Sneh et al. | | 2003/0134508 A1 | 7/2003 | Raaijmakers et al. |
| 2002/0164421 A1 | 11/2002 | Chiang et al. | | 2003/0139005 A1 | 7/2003 | Song et al. |
| 2002/0164423 A1 | 11/2002 | Chiang et al. | | 2003/0140854 A1 | 7/2003 | Kilpi |
| 2002/0172768 A1 | 11/2002 | Endo et al. | | 2003/0143328 A1 | 7/2003 | Chen et al. |
| 2002/0173130 A1 | 11/2002 | Pomerede et al. | | 2003/0143747 A1 | 7/2003 | Bondestam et al. |
| 2002/0175393 A1 | 11/2002 | Baum et al. | | 2003/0143839 A1 | 7/2003 | Raaijmakers et al. |
| 2002/0177282 A1 | 11/2002 | Song | | 2003/0143841 A1 | 7/2003 | Yang et al. |
| 2002/0182320 A1 | 12/2002 | Leskela et al. | | 2003/0153177 A1 | 8/2003 | Tepman et al. |
| 2002/0185755 A1* | 12/2002 | Pluckhahn et al. .......... 261/116 | | 2003/0160277 A1 | 8/2003 | Bhattacharyya |
| 2002/0187256 A1 | 12/2002 | Elers et al. | | 2003/0165615 A1 | 9/2003 | Aaltonen et al. |
| 2002/0187631 A1 | 12/2002 | Kim et al. | | 2003/0166318 A1 | 9/2003 | Zheng et al. |
| 2002/0195643 A1 | 12/2002 | Harada | | 2003/0167612 A1 | 9/2003 | Kraus et al. |
| 2002/0196591 A1 | 12/2002 | Hujanen et al. | | 2003/0168750 A1 | 9/2003 | Basceri et al. |
| 2002/0197402 A1 | 12/2002 | Chiang et al. | | 2003/0172872 A1 | 9/2003 | Thakur et al. |
| 2002/0197856 A1 | 12/2002 | Matsuse et al. | | 2003/0173586 A1 | 9/2003 | Moriwaki et al. |
| 2002/0197863 A1 | 12/2002 | Mak et al. | | 2003/0185980 A1 | 10/2003 | Endo |
| 2002/0197881 A1 | 12/2002 | Ramdani et al. | | 2003/0186495 A1 | 10/2003 | Saanila et al. |
| 2002/0197883 A1 | 12/2002 | Niimi et al. | | 2003/0186561 A1 | 10/2003 | Law et al. |
| 2003/0004723 A1 | 1/2003 | Chihara | | 2003/0188682 A1 | 10/2003 | Tois et al. |
| 2003/0010451 A1 | 1/2003 | Tzu et al. | | 2003/0189232 A1 | 10/2003 | Law et al. |
| 2003/0013300 A1 | 1/2003 | Byun | | 2003/0190423 A1 | 10/2003 | Yang et al. |

| | | | | | | |
|---|---|---|---|---|---|---|
| 2003/0190497 A1 | 10/2003 | Yang et al. | | 2004/0144311 A1 | 7/2004 | Chen et al. |
| 2003/0190804 A1 | 10/2003 | Glenn et al. | | 2004/0144431 A1 | 7/2004 | Yudovsky |
| 2003/0194493 A1 | 10/2003 | Chang et al. | | 2004/0157391 A1 | 8/2004 | Park et al. |
| 2003/0194825 A1 | 10/2003 | Law et al. | | 2004/0170403 A1 | 9/2004 | Lei |
| 2003/0194853 A1 | 10/2003 | Jeon | | 2004/0175961 A1 | 9/2004 | Olsen |
| 2003/0198740 A1 | 10/2003 | Wendling | | 2004/0187304 A1 | 9/2004 | Chen et al. |
| 2003/0198754 A1 | 10/2003 | Xi et al. | | 2004/0194691 A1 | 10/2004 | George et al. |
| 2003/0205729 A1 | 11/2003 | Basceri et al. | | 2004/0197492 A1 | 10/2004 | Chen et al. |
| 2003/0213560 A1 | 11/2003 | Wang et al. | | 2004/0198069 A1 | 10/2004 | Metzner et al. |
| 2003/0213987 A1 | 11/2003 | Basceri et al. | | 2004/0203254 A1 | 10/2004 | Conley et al. |
| 2003/0215570 A1 | 11/2003 | Seutter et al. | | 2004/0209460 A1 | 10/2004 | Xi et al. |
| 2003/0216981 A1 | 11/2003 | Tillman | | 2004/0211665 A1 | 10/2004 | Yoon et al. |
| 2003/0219942 A1 | 11/2003 | Choi et al. | | 2004/0214354 A1 | 10/2004 | Marsh et al. |
| 2003/0221780 A1 | 12/2003 | Lei et al. | | 2004/0216670 A1 | 11/2004 | Gutsche et al. |
| 2003/0224107 A1 | 12/2003 | Lindfors et al. | | 2004/0219784 A1 | 11/2004 | Kang et al. |
| 2003/0224578 A1 | 12/2003 | Chung et al. | | 2004/0224089 A1 | 11/2004 | Singh et al. |
| 2003/0224600 A1 | 12/2003 | Cao et al. | | 2004/0224506 A1 | 11/2004 | Choi et al. |
| 2003/0227033 A1 | 12/2003 | Ahn et al. | | 2004/0235285 A1 | 11/2004 | Kang et al. |
| 2003/0232497 A1 | 12/2003 | Xi et al. | | 2004/0241321 A1 | 12/2004 | Ganguli et al. |
| 2003/0232501 A1 | 12/2003 | Kher et al. | | 2004/0253375 A1 | 12/2004 | Ivanov et al. |
| 2003/0232506 A1 | 12/2003 | Metzner et al. | | 2004/0256351 A1 | 12/2004 | Chung et al. |
| 2003/0232511 A1 | 12/2003 | Metzner et al. | | 2004/0256664 A1 | 12/2004 | Chou et al. |
| 2003/0232513 A1 | 12/2003 | Kraus et al. | | 2004/0266175 A1 | 12/2004 | Chen et al. |
| 2003/0232554 A1 | 12/2003 | Blum et al. | | 2005/0006799 A1 | 1/2005 | Gregg et al. |
| 2003/0234417 A1 | 12/2003 | Raaijmakers et al. | | 2005/0008779 A1 | 1/2005 | Yang et al. |
| 2003/0235961 A1 | 12/2003 | Metzner et al. | | 2005/0009325 A1 | 1/2005 | Chung et al. |
| 2004/0005450 A1* | 1/2004 | Aanestad ............ 428/304.4 | | 2005/0009371 A1 | 1/2005 | Metzner et al. |
| 2004/0005749 A1 | 1/2004 | Choi et al. | | 2005/0012975 A1 | 1/2005 | George et al. |
| 2004/0007747 A1 | 1/2004 | Visokay et al. | | 2005/0037627 A1 | 2/2005 | Dussarrat et al. |
| 2004/0009307 A1 | 1/2004 | Koh et al. | | 2005/0059240 A1 | 3/2005 | Choi et al. |
| 2004/0009336 A1 | 1/2004 | Marcadal et al. | | 2005/0064207 A1 | 3/2005 | Senzaki et al. |
| 2004/0009675 A1 | 1/2004 | Eissa et al. | | 2005/0070126 A1 | 3/2005 | Senzaki |
| 2004/0011404 A1 | 1/2004 | Ku et al. | | 2005/0074968 A1 | 4/2005 | Chen et al. |
| 2004/0011504 A1 | 1/2004 | Ku et al. | | 2005/0095859 A1 | 5/2005 | Chen et al. |
| 2004/0013577 A1 | 1/2004 | Ganguli et al. | | 2005/0104142 A1 | 5/2005 | Narayanan et al. |
| 2004/0013803 A1 | 1/2004 | Chung et al. | | 2005/0106865 A1 | 5/2005 | Chung et al. |
| 2004/0014320 A1 | 1/2004 | Chen et al. | | 2005/0115675 A1 | 6/2005 | Tzu et al. |
| 2004/0015300 A1 | 1/2004 | Ganguli et al. | | 2005/0118804 A1 | 6/2005 | Byun et al. |
| 2004/0016404 A1 | 1/2004 | Gregg et al. | | 2005/0130438 A1 | 6/2005 | Rotondaro et al. |
| 2004/0016973 A1 | 1/2004 | Rotondaro et al. | | 2005/0139160 A1 | 6/2005 | Lei et al. |
| 2004/0018304 A1 | 1/2004 | Chung et al. | | 2005/0139948 A1 | 6/2005 | Chung et al. |
| 2004/0018723 A1 | 1/2004 | Byun et al. | | 2005/0153571 A1 | 7/2005 | Senzaki |
| 2004/0018738 A1 | 1/2004 | Liu | | 2005/0164487 A1 | 7/2005 | Seutter et al. |
| 2004/0018747 A1 | 1/2004 | Lee et al. | | 2005/0173068 A1 | 8/2005 | Chen et al. |
| 2004/0023461 A1 | 2/2004 | Ahn et al. | | 2005/0189072 A1 | 9/2005 | Chen et al. |
| 2004/0023462 A1 | 2/2004 | Rotondaro et al. | | 2005/0208217 A1 | 9/2005 | Shinriki et al. |
| 2004/0025370 A1 | 2/2004 | Guenther | | 2005/0220998 A1 | 10/2005 | Chang et al. |
| 2004/0028952 A1 | 2/2004 | Cartier et al. | | 2005/0229969 A1 | 10/2005 | Nguyen et al. |
| 2004/0029321 A1 | 2/2004 | Ang et al. | | 2005/0233156 A1 | 10/2005 | Senzaki et al. |
| 2004/0033698 A1 | 2/2004 | Lee et al. | | 2005/0252449 A1 | 11/2005 | Nguyen et al. |
| 2004/0036111 A1 | 2/2004 | Nishikawa et al. | | 2005/0255243 A1 | 11/2005 | Senzaki |
| 2004/0038486 A1 | 2/2004 | Chua et al. | | 2005/0255690 A1 | 11/2005 | Chen et al. |
| 2004/0038554 A1 | 2/2004 | Ahn et al. | | 2005/0257735 A1 | 11/2005 | Guenther |
| 2004/0040501 A1 | 3/2004 | Vaartstra | | 2005/0260347 A1 | 11/2005 | Narwankar et al. |
| 2004/0043149 A1 | 3/2004 | Gordon et al. | | 2005/0260357 A1 | 11/2005 | Olsen et al. |
| 2004/0043569 A1 | 3/2004 | Ahn et al. | | 2005/0266682 A1 | 12/2005 | Chen et al. |
| 2004/0043623 A1 | 3/2004 | Liu et al. | | 2005/0271812 A1 | 12/2005 | Myo et al. |
| 2004/0043630 A1 | 3/2004 | Vaartstra et al. | | 2005/0271813 A1 | 12/2005 | Kher et al. |
| 2004/0046197 A1 | 3/2004 | Basceri et al. | | 2005/0271814 A1 | 12/2005 | Chang et al. |
| 2004/0048461 A1 | 3/2004 | Chen et al. | | 2005/0277290 A1 | 12/2005 | Yang et al. |
| 2004/0048491 A1 | 3/2004 | Jung et al. | | 2006/0018639 A1 | 1/2006 | Ramamurthy et al. |
| 2004/0051152 A1 | 3/2004 | Nakajima | | 2006/0019032 A1 | 1/2006 | Wang et al. |
| 2004/0053484 A1 | 3/2004 | Kumar et al. | | 2006/0019033 A1 | 1/2006 | Muthukrishnan et al. |
| 2004/0065255 A1 | 4/2004 | Yang et al. | | 2006/0019494 A1 | 1/2006 | Cao et al. |
| 2004/0067641 A1 | 4/2004 | Yudovsky | | 2006/0019495 A1 | 1/2006 | Marcadal et al. |
| 2004/0069227 A1 | 4/2004 | Ku et al. | | 2006/0030148 A1 | 2/2006 | Seutter et al. |
| 2004/0071897 A1 | 4/2004 | Verplancken et al. | | 2006/0035025 A1 | 2/2006 | Verplancken et al. |
| 2004/0077182 A1 | 4/2004 | Lim et al. | | 2006/0057843 A1 | 3/2006 | Chen et al. |
| 2004/0077183 A1 | 4/2004 | Chung | | 2006/0062917 A1 | 3/2006 | Muthukrishnan et al. |
| 2004/0105934 A1 | 6/2004 | Chang et al. | | 2006/0075966 A1 | 4/2006 | Chen et al. |
| 2004/0143370 A1 | 7/2004 | Lu et al. | | 2006/0084283 A1 | 4/2006 | Paranjpe et al. |
| 2004/0144308 A1 | 7/2004 | Yudovsky | | 2006/0128150 A1 | 6/2006 | Gandikota et al. |
| 2004/0144309 A1 | 7/2004 | Yudovsky | | 2006/0148253 A1 | 7/2006 | Chung et al. |

| | | | | | | |
|---|---|---|---|---|---|---|
| 2006/0153973 A1 | 7/2006 | Chang et al. | JP | 05047666 | 2/1993 | |
| 2006/0153995 A1 | 7/2006 | Narwankar et al. | JP | 05074724 | 3/1993 | |
| 2006/0156979 A1 | 7/2006 | Thakur et al. | JP | 05206036 | 8/1993 | |
| 2006/0178018 A1 | 8/2006 | Olsen | JP | 05234899 | 9/1993 | |
| 2006/0199372 A1 | 9/2006 | Chung et al. | JP | 05251339 | 9/1993 | |
| 2006/0208215 A1 | 9/2006 | Metzner et al. | JP | 05270997 | 10/1993 | |
| 2006/0213557 A1 | 9/2006 | Ku et al. | JP | 06177381 | 6/1994 | |
| 2006/0213558 A1 | 9/2006 | Ku et al. | JP | 06196809 | 7/1994 | |
| 2006/0216928 A1 | 9/2006 | Chung et al. | JP | 09082696 | 3/1997 | |
| 2006/0223286 A1 | 10/2006 | Chin et al. | JP | 10308283 | 11/1998 | |
| 2006/0223339 A1 | 10/2006 | Metzner et al. | JP | 11269652 | 10/1999 | |
| 2006/0257295 A1 | 11/2006 | Chen et al. | JP | 2000031387 | 1/2000 | |
| 2006/0264067 A1 | 11/2006 | Kher et al. | JP | 2000058777 | 2/2000 | |
| 2006/0276020 A1 | 12/2006 | Yoon et al. | JP | 2000212752 | 8/2000 | |
| 2006/0286774 A1 | 12/2006 | Singh et al. | JP | 2000319772 | 11/2000 | |
| 2006/0286775 A1 | 12/2006 | Singh et al. | JP | 2001020075 | 1/2001 | |
| 2006/0286776 A1 | 12/2006 | Ranish et al. | JP | 2001111000 | 4/2001 | |
| 2006/0286818 A1 | 12/2006 | Wang et al. | JP | 2001172767 | 6/2001 | |
| 2006/0286819 A1 | 12/2006 | Seutter et al. | JP | 2001220294 | 8/2001 | |
| 2006/0286820 A1 | 12/2006 | Singh et al. | JP | 2001254181 | 9/2001 | |
| 2006/0292864 A1 | 12/2006 | Yang et al. | JP | 2001328900 | 11/2001 | |
| 2007/0003698 A1 | 1/2007 | Chen et al. | JP | 2002060944 | 2/2002 | |
| 2007/0018244 A1 | 1/2007 | Hung et al. | JP | 2002069641 | 3/2002 | |
| 2007/0020890 A1 | 1/2007 | Thakur et al. | JP | 2002093804 | 3/2002 | |
| 2007/0026147 A1 | 2/2007 | Chen et al. | JP | 2002167672 | 6/2002 | |
| 2007/0044719 A1 | 3/2007 | Ku et al. | JP | 2002172767 | 6/2002 | |
| 2007/0049043 A1 | 3/2007 | Muthukrishnan et al. | WO | WO-9617107 | 6/1996 | |
| 2007/0049053 A1 | 3/2007 | Mahajani | WO | WO-9901595 | 1/1999 | |
| 2007/0059948 A1 | 3/2007 | Metzner et al. | WO | WO-9919260 | 4/1999 | |
| 2007/0065578 A1 | 3/2007 | McDougall | WO | WO-9929924 | 6/1999 | |
| 2007/0067609 A1 | 3/2007 | Chen et al. | WO | WO-9965064 | 12/1999 | |
| 2007/0079759 A1 | 4/2007 | Lee et al. | WO | WO-0013235 | 3/2000 | |
| 2007/0089817 A1 | 4/2007 | Ganguli et al. | WO | WO-0015865 | 3/2000 | |
| 2007/0095285 A1 | 5/2007 | Thakur et al. | WO | WO-0016377 | 3/2000 | |
| 2007/0099415 A1 | 5/2007 | Chen et al. | WO | WO-0054320 | 9/2000 | |
| 2007/0110898 A1 | 5/2007 | Ganguli et al. | WO | WO-0063957 | 10/2000 | |
| 2007/0119370 A1 | 5/2007 | Ma et al. | WO | WO-0070674 | 11/2000 | |
| 2007/0119371 A1 | 5/2007 | Ma et al. | WO | WO-0079576 | 12/2000 | |
| 2007/0128862 A1 | 6/2007 | Ma et al. | WO | WO-0115220 | 3/2001 | |
| 2007/0128863 A1 | 6/2007 | Ma et al. | WO | WO-0117692 | 3/2001 | |
| 2007/0128864 A1 | 6/2007 | Ma et al. | WO | WO-0125502 | 4/2001 | |
| 2007/0151514 A1 | 7/2007 | Chen et al. | WO | WO-0127346 | 4/2001 | |
| 2007/0235085 A1 | 10/2007 | Nakashima et al. | WO | WO-0127347 | 4/2001 | |
| 2007/0252500 A1 | 11/2007 | Ranish et al. | WO | WO-0129280 | 4/2001 | |
| 2008/0038463 A1 | 2/2008 | Chen et al. | WO | WO-0129891 | 4/2001 | |
| 2008/0041307 A1 | 2/2008 | Nguyen et al. | WO | WO-0129893 | 4/2001 | |
| 2008/0041313 A1 | 2/2008 | Chen et al. | WO | WO-0136702 | 5/2001 | |
| 2008/0044569 A1 | 2/2008 | Myo et al. | WO | WO-0140541 | 6/2001 | |
| 2008/0102203 A1 | 5/2008 | Wu et al. | WO | WO-0166832 | 9/2001 | |
| 2008/0102208 A1 | 5/2008 | Wu et al. | WO | WO-0182390 | 11/2001 | |
| 2008/0107809 A1 | 5/2008 | Wu et al. | WO | WO-0199166 | 12/2001 | |
| 2008/0268171 A1 | 10/2008 | Ma et al. | WO | WO-0201628 | 1/2002 | |
| 2008/0274299 A1 | 11/2008 | Chen et al. | WO | WO-0208485 | 1/2002 | |
| | | | WO | WO-0208488 | 1/2002 | |
| FOREIGN PATENT DOCUMENTS | | | WO | WO-0209167 | 1/2002 | |
| | | | WO | WO-0227063 | 4/2002 | |
| EP | 0497267 | 8/1992 | WO | WO-0231875 | 4/2002 | |
| EP | 0973189 | 1/2000 | WO | WO-0243115 | 5/2002 | |
| EP | 0973191 | 1/2000 | WO | WO-0245167 | 6/2002 | |
| EP | 1146141 | 10/2001 | WO | WO-0245871 | 6/2002 | |
| EP | 1167569 | 1/2002 | WO | WO-0246489 | 6/2002 | |
| EP | 1170804 | 1/2002 | WO | WO-02065525 | 8/2002 | |
| EP | 1321973 | 6/2003 | WO | WO-02067319 | 8/2002 | |
| GB | 2355727 | 5/2001 | WO | WO-03023835 | 3/2003 | |
| JP | 58098917 | 6/1983 | WO | WO-2004008491 | 1/2004 | |
| JP | 64082671 | 3/1989 | WO | WO-2004010471 | 1/2004 | |
| JP | 01143221 | 6/1989 | WO | WO-2004106584 | 12/2004 | |
| JP | 02014513 | 1/1990 | | | | |
| JP | 02230690 | 9/1990 | | | | |
| JP | 02246161 | 10/1990 | | | | |
| JP | 03234025 | 10/1991 | | | | |
| JP | 04291916 | 10/1992 | | | | |
| JP | 05029228 | 2/1993 | | | | |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

Balog, et al. "Chemical Vapor Deposition and Characterization of $HfO_2$ Films from Organo-Hafnium Compounds," Thin Solid Films, 41 (1977) 247-259.

Bedair, "Atomic Layer Epitaxy Deposition Processes," J. Vac. Sci. Technol. B., vol. 12, No. 1, Jan./Feb. 1994.

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Choi, et al. "Stability of $TiB_2$ as a Diffusion Barrier on Silicon," J. Electrochem. Soc., vol. 138, No. 10, Oct. 1991 pp. 3062-3067.

Choi, et al "The Effect of Annealing on Resistivity of Low Pressure Chemical Vapor Deposited Titanium Diboride," J. Appl. Phys. 69(11), Jun. 1, 1991 pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, et al. "Interval Annealing During Alternating Pulse Deposition", Mat. Res. Soc. Symp. Proc. vol. 811, Apr. 12-16, 2004, D1.3.1.

Derbyshire "Applications of Integrated Processing," Solid State Technology, Dec. 1994 pp. 45-48.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01 EX461) 2001.

Elers, et al. "$NbCl_5$ as a Precursor in Atomic Layer Epitaxy," Applied Surface Science 82/83 (1994) pp. 468-474.

European Office Action dated Jun. 3, 2008 for European Application No. 05 748 115.2-1215.

European Search Report dated Sep. 23, 2005 from European Application No. 03257169.7.

Ferguson, et al. "Atomic Layer Deposition of $Al_2O_3$ and $SiO_2$ on BN Particles Using Sequential Surface Reactions," Applied Surface Science, 162-163, (2000), pp. 280-292.

George, et al. "Atomic Layer Controlled Deposition of $SiO_2$ and $Al_2O_3$ using ABAB . . . binary reaction sequence chemistry," Applied Surface Science 82/83 (1994) 460-467.

George, et al. "Surface Chemistry for Atomic Layer Growth," J. Phys. Chem. (1996), 100, 13121-13131.

Goswami, et al. Transition Metals Show Promise as Copper Barriers, Semiconductor International, ATMI, San Jose—May 1, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Groner, et al. "High-k Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulsed Deposition of Silicate Films," Journal of Applied Physics, vol. 94, No. 5, Sep. 1, 2003, pp. 3657-3659.

Hendrix, et al. "Composition control of $Hf_{1-x}Si_xO_2$ films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size $\alpha$-$PbO_2$-Type $TiO_2$ in Garnet: A Thermobarometer for Ultrahigh-Pressure Metamorphism," Science Vo. 288 (Apr. 14, 2000) pp. 321-324.

International Preliminary Report on Patentability for International Application No. PCT/US2004/008961 dated Oct. 27, 2005.

International Search Report for International Application No. PCT/US2005/016690 dated Aug. 22, 2005.

International Search Report and Written Opinion dated Sep. 12, 2008 for International Application No. PCT/US07/82369.

International Search Report for International Application No. PCT/US2005/016603 dated Sep. 15, 2005.

International Search Report for International Application No. PCT/US2005/016606 dated Aug. 22, 2005.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using $HfCl_2N(SiMe_3)_2)_2$ and $H_2O$," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kim, et al. "Substrate dependence on the optical properties of $Al_2O_3$ films grown by atomic layer deposition," Applied. Phys. Lett. 71 (25), Dec. 22, 1997 (3604-6).

Klaus, et al. "Atomic Layer Deposition of SiO2 Using Catalyzed and Uncatalyzed Self-Limiting Surface Reactions," Surface Review and Letters, vol. 6, Nos. 3 & 4 (1999) 435-448.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-5.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al. "Properties of $\{Nbi_{1-x}Ta_x\}_2O_5$ Solid Solutions and $\{Nbi_{1-x}Ta_x\}_2O_5$-$ZrO_2$ Nanolaminates Grown by Atomic Layer Epitaxy," 1997; p. 785-93.

Kukli, et al "Properties of Ta2O5-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee, et al "Cyclic Technique for the Enhancement of Highly Oriented Diamond Film Growth," Thin Solid Films 303 (1997) pp. 264-269.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Min, et al. "Atomic Layer Deposition of TiN Thin Films by Sequential Introduction of Ti Precursor and $NH_3$," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride Films," Applied Physics Letters, vol. 75, No. 11 (Sep. 11, 1999) pp. 1521-1523.

Niinisto, et al. "Synthesis of Oxide Thin Films and Overlayers by Atomic Layer Epitaxy for Advanced Applications," Materials Science and Engineering B41 (1996) 23-29.

Ohshita, et al. "$Hf_{1-x}Si_xO_2$ deposition by metal organic chemical vapor deposition using the $Hf(NEt_2)_4/SiH(NEt_2)_3/O_2$ gas system", Preparation and Characterization, Elsevier Sequioa, NL, vol. 416, No. 1-2, Sep. 2, 2002, pp. 208-211.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Paranjpe, et al. "Atomic Layer Deposition of $AlO_x$ for Thin Film Head Gap Applications," J. Elec. Soc., vol. 148, No. 9 Sep. 2001 pp. G465-471.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Partial International Search Report for International Application No. PCT/US2005/016694 dated Oct. 13, 2005.

Proceedings of the ICEEE 1998 International Interconnect Technology Conference—San Francisco, California, Jun. 1-3, 1998.

Ritala, et al. Ann. Acad. Sci. Fenn. Ser. A II. Chemica 257 (1994) 1-48.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Deposition of Oxide Thin Films with Metal Alkoxides as Oxygen Sources," Science, vol. 288, Apr. 14, 2000, pp. 319-321.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Development of Crystallinity and Morphology in Hafnium Dioxide Thin Films Grown by Atomic Layer Epitaxy," Thin Solid Films, Vol. 250, No. 1-2, (Oct. 1, 1994), p. 72-80.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, al. et al "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003), pp. 91-98.

Visokay, et al. "Application of HfSiON as a gate dielectric material", Applied Physics Letter, American Institute of Physics, New York, US, vol. 80, No. 17, Apr. 29, 2002, pp. 3183-3185.

Written Opinion of the International Search Report for International Application No. PCT/US2005/016603 dated Sep. 15, 2005.

Written Opinion of the International Search Report for International Application No. PCT/US2005/016606 dated Aug. 22, 2005.

Written Opinion of the International Search Report for International Application No. PCT/US2005/016690 dated Aug. 22, 2005.

Written Opinion of the International Searching Authority for Preliminary Report on Patentability for International Application No. PCT/US2004/008961 dated Oct. 27, 2005.

Notification of First Office Action dated Feb. 20, 2009 for Chinese Patent Application No. 2005800084063.

* cited by examiner

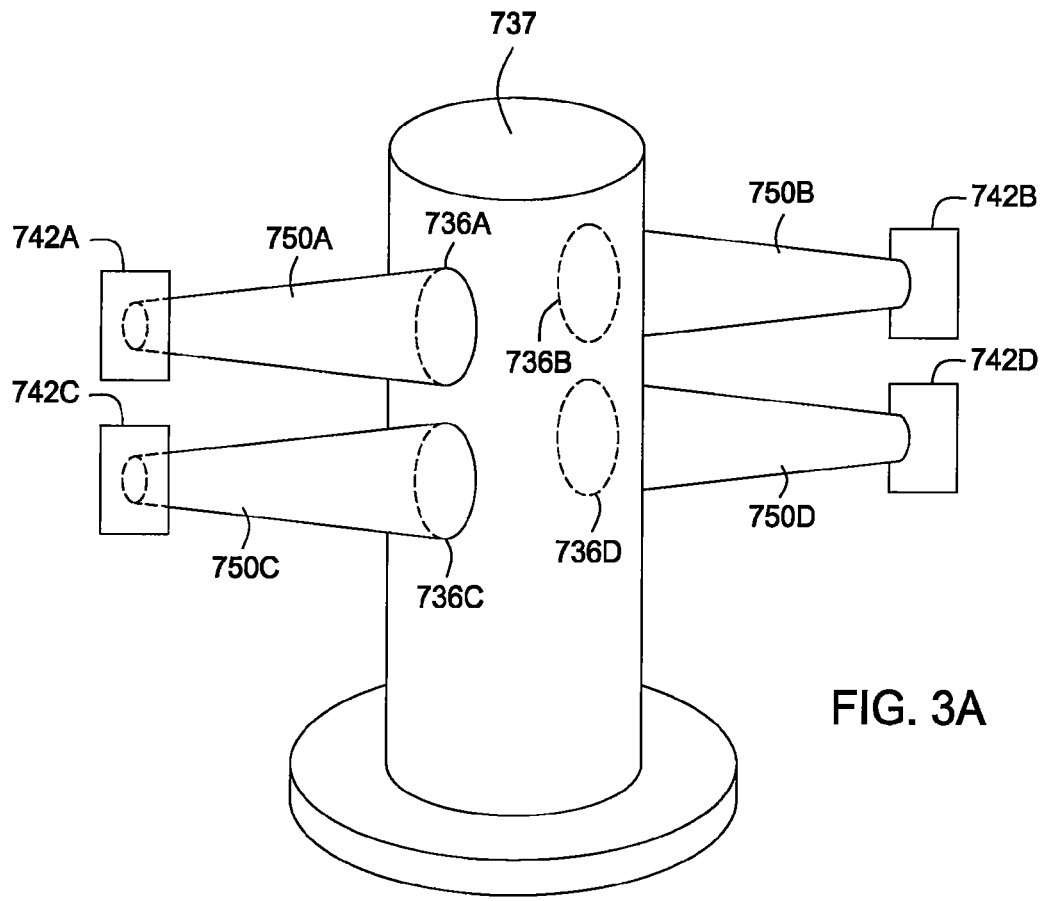
FIG. 3A
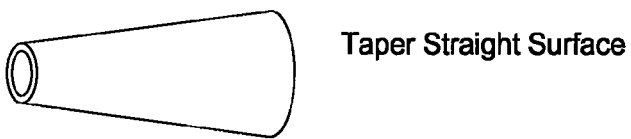
Taper Straight Surface
Concave Surface
FIG. 3B
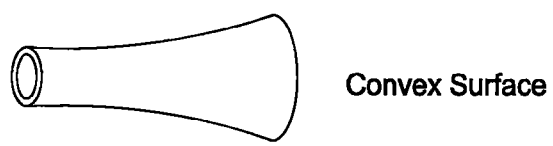
Convex Surface (A)

(B)

CONTROL OF GAS FLOW AND DELIVERY TO SUPPRESS THE FORMATION OF PARTICLES IN AN MOCVD/ALD SYSTEM

CROSS-REFERENCE TO RELATED APPLICATIONS

This is a divisional of U.S. Ser. No. 11/119,388, filed Apr. 29, 2005, now abandoned, which claims benefit of U.S. Ser. No. 60/570,173, filed on May 12, 2004, which are herein incorporated by reference in their entirety.

BACKGROUND OF THE INVENTION

Field of the Invention

Embodiments of the present invention generally relate to an apparatus and a method to deposit materials on substrates, and more specifically, to an apparatus and a method for depositing hafnium-containing compounds, such as hafnium oxides or hafnium silicates using atomic layer deposition processes.

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

While conventional chemical vapor deposition has proved successful for device geometries and aspect ratios down to 0.15 microns, the more aggressive device geometries require new, innovative deposition techniques. One technique that is receiving considerable attention is atomic layer deposition (ALD). In the scheme, reactants are sequentially introduced into a processing chamber where each reactant chemisorbs onto the substrate surface and a reaction occurs. A purge step is typically carried out between the deliveries of each reactant gas. The purge step may be a continuous purge with the carrier gas or a pulse purge between the deliveries of the reactant gases.

Controlled and repeatable reactive gas delivery and particle suppression are challenges for advanced ALD processing to deposit films, especially for depositing hafnium-containing compounds. Therefore, there is a need for an ALD apparatus to deposit materials, such as hafnium oxides and hafnium silicates, that are repeatable and under control with adequate particle suppression.

SUMMARY OF THE INVENTION

The embodiments of the invention describe a process chamber that has gas conduits with gradually increasing diameters to reduce Joule-Thompson effect during gas delivery, a gas liner leveled with the substrate support to sustain gas temperature and to reduce gas flow to the substrate support backside, and a gas reservoir to allow controlled delivery of process gas. In one embodiment, a gas delivery assembly comprises a covering member comprising an expanding channel at a central portion of the covering member which comprises a bottom surface extending from the expanding channel to a peripheral portion of the covering member, and at least one gas conduit having a first end, with a first diameter, connected to a gas inlet of the expanding channel, and a second end, with a second diameter, connected to a valve, wherein the first diameter is greater than the second diameter and the diameter of the at least one gas conduit gradually and continuously increases from the second diameter to the first diameter, and the at least one gas conduit is positioned at an angle from a center of the expanding channel.

In another embodiment, an ALD process chamber comprises a ring-shaped gas liner placed between the substrate support and between the chamber wall, wherein the top surface of the ring-shaped liner is at the same level as the substrate support during exhaust gas being pumped out the process chamber.

In another embodiment, an ALD process chamber comprises at least one reservoir to store one process gas, wherein the first end of the at least one reservoir is coupled to a gas valve that connects to a gas conduit with a length between about 3 cm to about 10 cm connecting a gas inlet of the process chamber and the second end of the at least one reservoir couples to a gas source, and the diameter of the first end of the at least one reservoir gradually and continuously reduces to the diameter of an inlet of the gas valve and the diameter of the second end of the at least one reservoir gradually and continuously reduces to a diameter of a gas line that connects with the gas source.

In another embodiment, an ALD process chamber comprises a covering member comprising an expanding channel at a central portion of the covering member which comprises a bottom surface extending from the expanding channel to a peripheral portion of the covering member, at least one gas conduit having a first end, with a first diameter, connected to a gas inlet of the expanding channel, and a second end, with a second diameter, connected to a gas valve, wherein the second diameter is greater than the first diameter and the diameter of the at least one gas conduit gradually and continuously increases from the second diameter to the first diameter, and the at least one gas conduit is positioned at an angle from a center of the expanding channel, and at least one reservoir to store one process gas, wherein the first end of the at least one reservoir is coupled to the gas valve that connects to the at least one gas conduit and the second end of the at least one reservoir couples to a gas source, and the diameter of the first end of the at least one reservoir gradually and continuously reduces to a third diameter of an inlet of the gas valve and the diameter of the second end of the at least one reservoir gradually and continuously reduces to a fourth diameter of a gas line that connects with the gas source.

In yet another embodiment, a method of delivering gases to a substrate in a substrate processing chamber comprises providing at least one gas into the substrate processing chamber from a reservoir wherein the first end of the reservoir is coupled to a gas valve that connects to a gas conduit, wherein the gas conduit having a first end, with a first diameter, connected to a gas inlet of a expanding channel of the substrate processing chamber, and a second end, with a second diameter, connected to the gas valve, wherein the first diameter is greater than the second diameter and the diameter of the gas conduit gradually and continuously increases from the second diameter to the first diameter, and the gas conduit is positioned at an angle from a center of the expanding channel, and the second end of the reservoir couples to a gas source, and the diameter of the first end of the reservoir gradually and continuously reduces to a third diameter of an inlet of the gas valve and the diameter of the second end of the reservoir gradually and continuously reduces to a fourth diameter of a gas line that connects with the gas source, and providing the gases to a central portion of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIG. 3A depicts a schematic drawing of one embodiment of gas conduits of current invention for delivering process gas(es) into the process chamber.

FIG. 3B shows examples of various profiles of gas conduits of the current invention.

DETAILED DESCRIPTION

The present invention describes embodiments of an apparatus and a method for depositing a thin film by processes such as atomic layer deposition. More specifically, the present invention describes embodiment of an ALD apparatus for preparing hafnium-containing compounds used in a variety of applications, including high-k dielectric materials.

"Atomic layer deposition" (ALD) or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A, such as a hafnium precursor, is pulsed into the reaction zone followed by a first time delay. Next, a second precursor or compound B, such as an oxidizing gas, is pulsed into the reaction zone followed by a second delay. The oxidizing gas may include several oxidizing agent, such as in-situ water and oxygen. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

Figure 1:
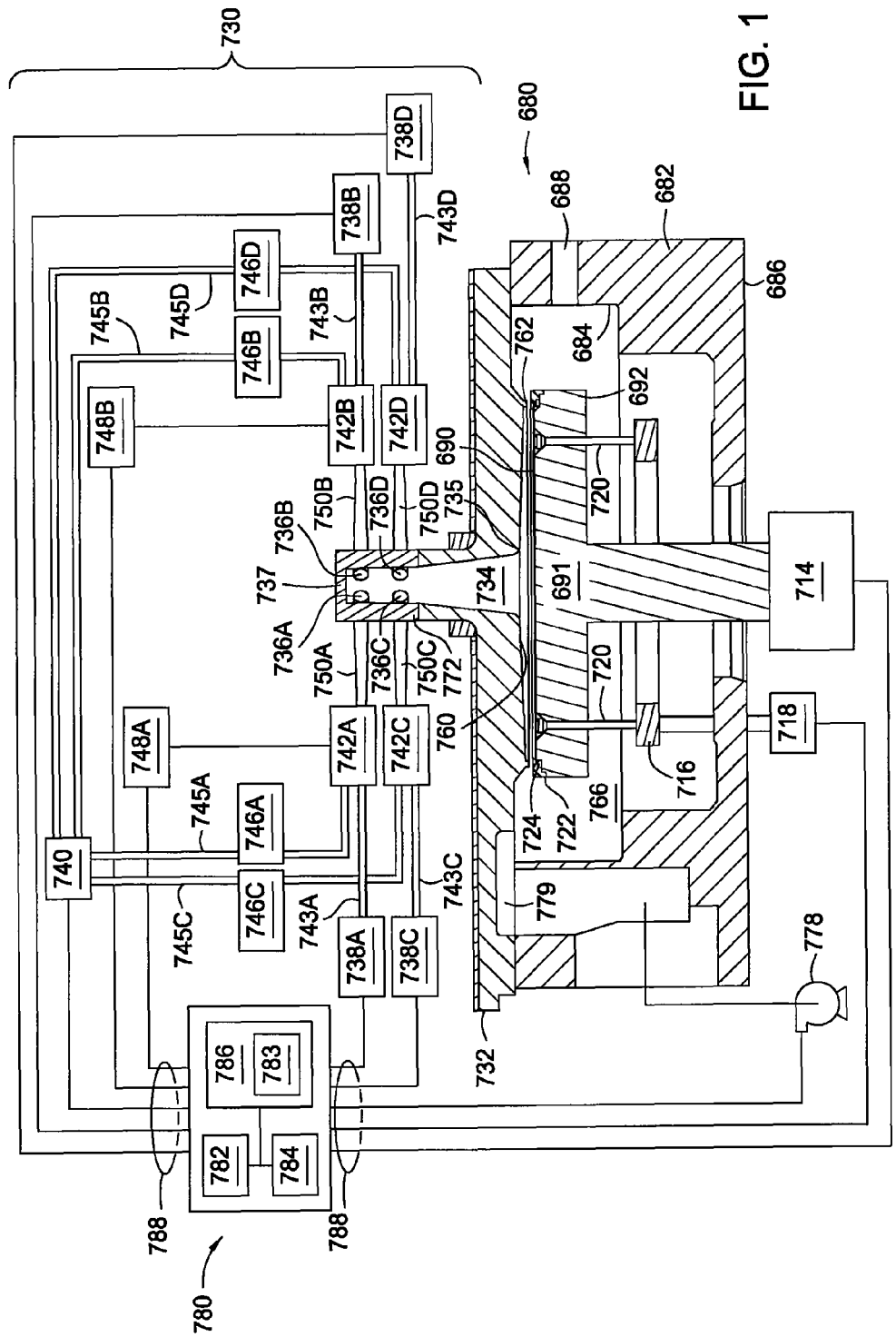
FIG. 1 depicts a schematic cross-sectional view of one embodiment of an ALD process chamber of the current invention.

FIG. 1 is a schematic cross-sectional view of an exemplary process chamber 680 including a gas delivery apparatus 730 adapted for cyclic deposition, such as atomic layer deposition or rapid chemical vapor deposition. The terms atomic layer deposition (ALD) and rapid chemical vapor deposition as used herein refer to the sequential introduction of reactants to deposit a thin layer over a substrate structure. The sequential introduction of reactants may be repeated to deposit a plurality of thin layers to form a conformal layer to a desired thickness. The process chamber 680 may also be adapted for other deposition techniques.

The process chamber 680 comprises a chamber body 682 having sidewalls 684 and a bottom 686. A slit valve 688 in the process chamber 680 provides access for a robot (not shown) to deliver and retrieve a substrate 690, such as a semiconductor wafer with a diameter of 200 mm or 300 mm or a glass substrate, from the process chamber 680. The process chamber 680 could be various types of ALD chambers. The details of exemplary process chamber 680 are described in commonly assigned United States Patent Application Publication No. 60/570,173, filed on May 12, 2004, entitled "Atomic Layer Deposition of Hafnium-containing High-k Materials, United States Patent Application Publication No. 20030079686, filed on Dec. 21, 2001, entitled "Gas Delivery Apparatus and Method For Atomic Layer Deposition", which are both incorporated herein in their entirety by references.

A substrate support 692 supports the substrate 690 on a substrate receiving surface 691 in the process chamber 680. The substrate support (or pedestal) 692 is mounted to a lift motor 714 to raise and lower the substrate support 692 and a substrate 90 disposed thereon. A lift plate 716 connected to a lift motor 718 is mounted in the process chamber 680 and raises and lowers pins 720 movably disposed through the substrate support 692. The pins 720 raise and lower the substrate 690 over the surface of the substrate support 692. The substrate support 692 may include a vacuum chuck, an electrostatic chuck, or a clamp ring for securing the substrate 690 to the substrate support 692 during processing.

The substrate support 692 may be heated to increase the temperature of a substrate 690 disposed thereon. For example, the substrate support 692 may be heated using an embedded heating element, such as a resistive heater, or may be heated using radiant heat, such as heating lamps disposed above the substrate support 692. A purge ring 722 may be disposed on the substrate support 692 to define a purge channel 724 which provides a purge gas to a peripheral portion of the substrate 690 to prevent deposition thereon.

A gas delivery apparatus 730 is disposed at an upper portion of the chamber body 682 to provide a gas, such as a process gas and/or a purge gas, to the process chamber 680. A vacuum system 778 is in communication with a pumping channel 779 to evacuate any desired gases from the process chamber 680 and to help maintain a desired pressure or a desired pressure range inside a pumping zone 766 of the process chamber 680.

In one embodiment, the chamber depicted by FIG. 1 permits the process gas and/or purge gas to enter the process chamber 680 normal (i.e., 90°) with respect to the plane of the substrate 690 via the gas delivery apparatus 730. Therefore, the surface of substrate 690 is symmetrically exposed to gases that allow uniform film formation on substrates. The process gas may include a hafnium-containing compound (e.g., TDEAH or $HfCl_4$) during one pulse and includes an oxidizing gas (e.g., water vapor) in another pulse. Process chamber 680 may dose a hafnium-containing compound for about 20 seconds or less, preferably process chamber 680 may dose the hafnium-containing compound for about 10 seconds or less, more preferably for about 5 second or less.

The process chamber 680 may be adapted to receive three or four gas flows through three or four gas inlets from three gas conduits. Each conduit is coupled to a single or plurality of valves. Further disclosure of process chamber 680 adapted to flow three process gas flows is described in paragraph 66 of commonly assigned United States Patent Application Publication No. 20030079686, which is both incorporated herein by reference. The three gas flows may be a hafnium precursor, a silicon precursor and an oxidizing gas, for example, the first flow includes $HfCl_4$, the second flow includes $(Me_2N)_3SiH$ and the third flow includes water vapor from a WVG system. The four gas flows may be a hafnium precursor, such as HfCl4, another hafnium precursor, such as TDEAH, a silicon precursor, such as $(Me_2N)_3SiH$, and an oxidizing gas, such as a water vapor from a WVG system.

The gas delivery apparatus 730 comprises a chamber lid 732. The chamber lid 732 includes an expanding channel 734 extending from a central portion of the chamber lid 732 and a bottom surface 760 extending from the expanding channel 734 to a peripheral portion of the chamber lid 732. The bottom surface 760 is sized and shaped to substantially cover a substrate 690 disposed on the substrate support 692. The chamber lid 732 may have a choke 762 at a peripheral portion of the chamber lid 732 adjacent the periphery of the substrate 690. The cap portion 772 includes a portion of the expanding channel 734 and gas inlets 736A, 736B, 736C, 736D. The expanding channel 734 has gas inlets 736A, 736B, 736C, 736D to provide gas flows from two similar valves 742A, 742B, 742C, 742D. The gas flows from the valves 742A, 742B, 742C, 742D may be provided together and/or separately.

In one embodiment, valves 742A, 742B, 742C, and 742D are coupled to separate reactant gas sources but are preferably coupled to the same purge gas source. For example, valve 742A is coupled to reactant gas source 738A and valve 742B is coupled to reactant gas source 738B, and both valves 742A, 742B are coupled to purge gas source 740. Each valve 742A, 742B, 742C, 742D includes a delivery line 743A, 743B, 743C 743D. The delivery line 743A, 743B, 743C, 743D is in communication with the reactant gas source 738A, 738B, 738C, 738D and is in communication with the gas inlet 736A, 736B, 736C, 736D of the expanding channel 734 through gas conduits 750A, 750B, 750C, 750D. Additional reactant gas sources, delivery lines, gas inlets and valves may be added to the gas delivery apparatus 730 in one embodiment (not shown). The purge lines, 745A, 745B, 745C, and 745D, are in communication with the purge gas source 740, and the flows of the purge lines, 745A, 745B, 745C, and 745D, are controlled by valves, 746A, 746B, 746C, and 746D, respectively. The purge lines, 745A, 745B, 745C, and 745D, intersect the delivery line 743A, 743B, 743C, 743D at the valves, 742A, 742B, 742C, and 742D. If a carrier gas is used to deliver reactant gases from the reactant gas source 738A, 738B, 738C, 738D, preferably the same gas is used as a carrier gas and a purge gas (e.g., nitrogen used as a carrier gas and a purge gas). The valves, 742A, 742B, 742C, and 742D, comprise diaphragms. The diaphragms may be biased open or closed and may be actuated closed or open respectively. The diaphragms may be pneumatically actuated or may be electrically actuated. Examples of pneumatically actuated valves include pneumatically actuated valves available from Swagelock of Solon, Ohio. Pneumatically actuated valves may provide pulses of gases in time periods as low as about 0.020 second. Electrically actuated valves may provide pulses of gases in time periods as low as about 0.005 second. An electrically actuated valve typically requires the use of a driver coupled between the valve and the programmable logic controller, such as 748A, 748B.

Each valve 742A, 742B, 742C, 742D may be adapted to provide a combined gas flow and/or separate gas flows of the reactant gas 738A, 738B, 738C, 738D and the purge gas 740. In reference to valve 742A, one example of a combined gas flow of the reactant gas 738A and the purge gas 740 provided by valve 742A comprises a continuous flow of a purge gas from the purge gas source 740 through purge line 745A and pulses of a reactant gas from the reactant gas source 738A through delivery line 743A.

The delivery lines, 743A, 743B, 743C, and 743D of the valves, 742A, 742B, 742C, and 742D, may be coupled to the gas inlets, 736A, 736B, 736C, and 736D, through gas conduits, 750A, 750B, 750C, and 750D. The gas conduits, 750A, 750B, 750C, and 750D, may be integrated or may be separate from the valves, 742A, 742B, 742C, and 742D. In one aspect, the valves 742A, 742B, 742C, 742D are coupled in close proximity to the expanding channel 734 to reduce any unnecessary volume of the delivery line 743A, 743B, 743C, 743D and the gas conduits 750A, 750B, 750C, 750D between the valves 742A, 742B, 742C, 742D and the gas inlets 736A, 736B, 736C, 736D.

The gas inlets 736A, 736B, 736C, 736D are located adjacent the upper portion 737 of the expanding channel 734. In other embodiments, one or more gas inlets may be located along the length of the expanding channel 734 between the upper portion 737 and the lower portion 735.

As described in the process example above, during film deposition, the hafnium precursor, such as $HfCl_4$, is maintained in a precursor bubbler at a temperature from about 150° C. to about 200° C. and is carried into the one of the gas inlets, such as 736A or 736B. When the hafnium precursor is introduced through the gas line into the process chamber 734, due to the pressure within the delivery line is considerably higher than the pressure in the process chamber, the gas delivered to the process chamber expand rapidly and the temperature of the gases drops. This is the "Joule-Thompson effect". This is also true when the water vapor is introduced into the process chamber.

For certain wafer processing steps, this temperature drop can have unwanted consequences. For example, consider the case of a gas delivering a low vapor pressure reactant. If this gas undergoes rapid expansion (the accompanying rapid cooling) as it leaves the manifold and enters the process chamber, the reactant may condense from vapor phase and precipitate into fine particles. Similarly, when the temperature drops below 100° C., water vapor also condenses into liquid.

Figure 2A:
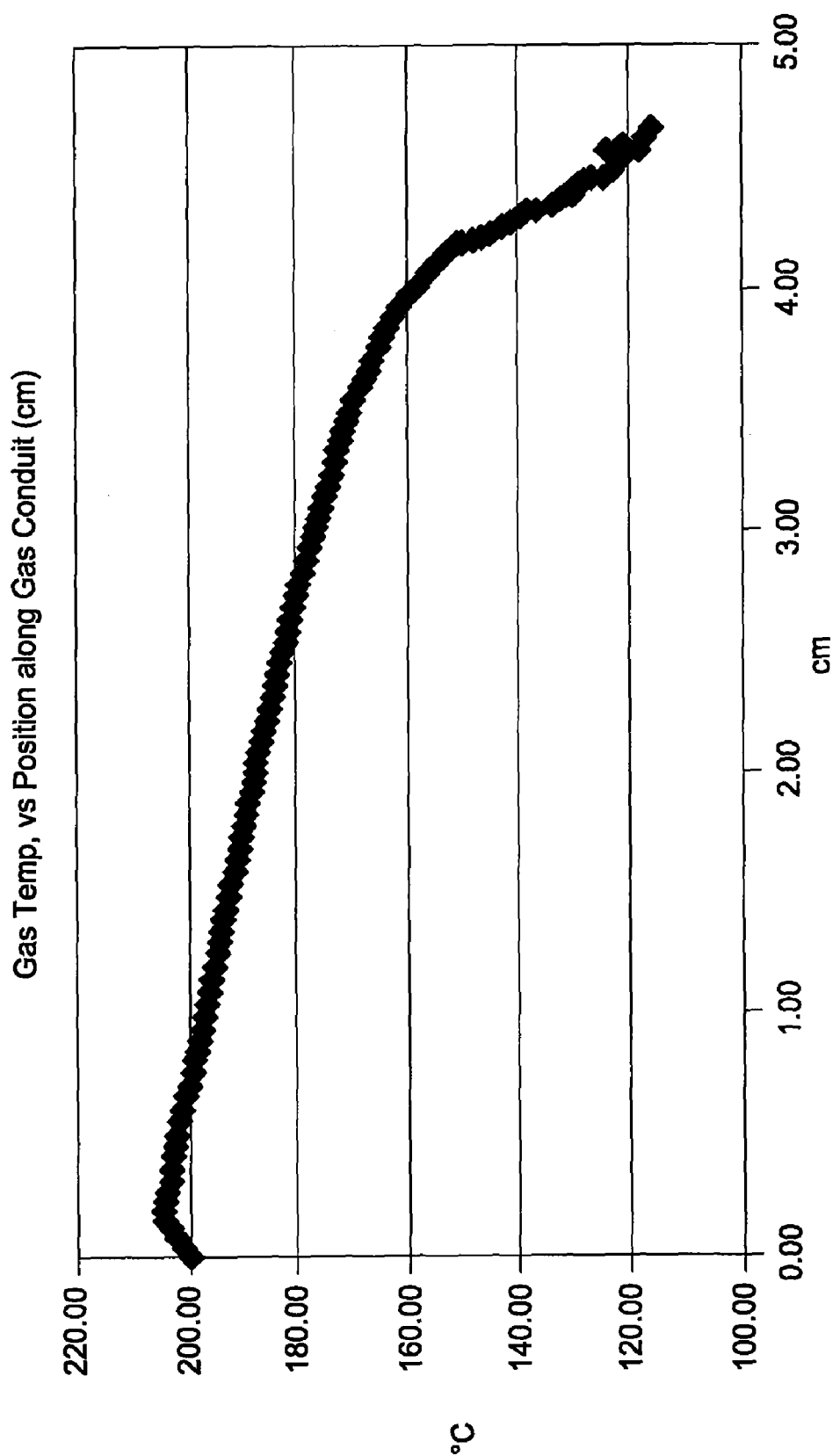
FIG. 2A shows the simulation result of gas temperature along a conventional gas conduit.
Figure 2B:
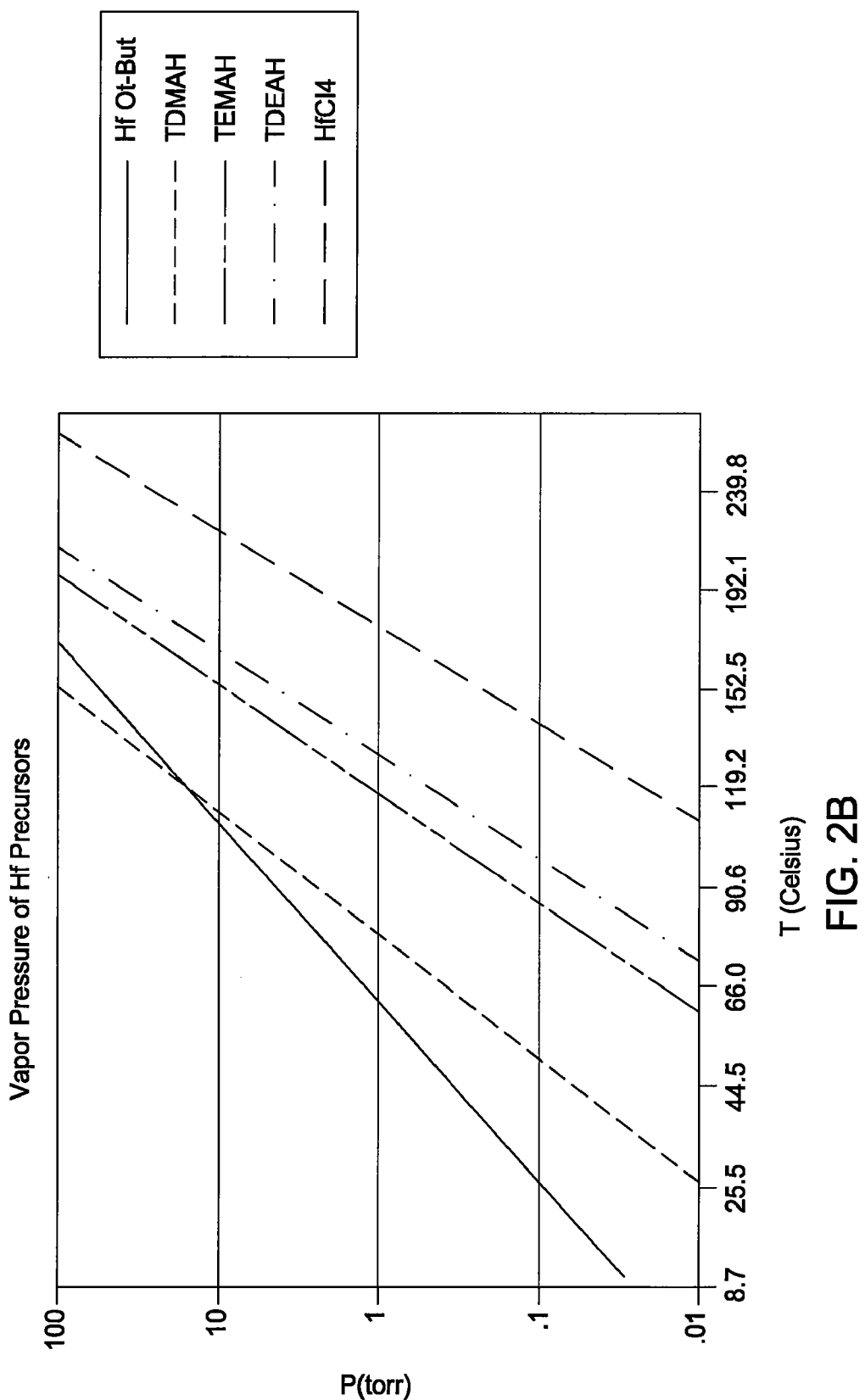
FIG. 2B shows the vapor pressures of hafnium precursors as a function of temperature.

FIG. 2A shows the simulated temperature drop of $N_2$ gas along an about 5 cm gas conduit with constant diameter. For temperature simulation, computation fluid dynamics (CFD) software CFD-ACE+ by ESI group of France is used. CFD-ACE+ is a general, partial differential equation (PDE) solver for a broad range of physics disciplines including: flow, heat transfer, stress/deformation, chemical kinetics, electrochemistry, and others. It solves them in multidimensional (0D to 3D), steady and transient form. CFD-ACE+ is used for complex multi-physics and multidisciplinary applications. The temperature drops from 200° C. to 108° C. FIG. 2B shows the vapor pressure of several hafnium precursors as function of temperature. FIG. 2B shows that the vapor pressure of these hafnium precursors drops quickly with lowering of temperature between 200° C. to 100° C. For $HfCl_4$, which is in solid form at room temperature, when the temperature goes below 150° C., the vaporized $HfCl_4$ precursor precipitates into solid. For TDEAH, which is in liquid form at room temperature, when the temperature goes below 110° C., the vaporized TDEAH condenses into liquid, which easily and undesirably decomposes if the surrounding temperature is greater than 150° C. The decomposed TDEAH could then react and form particles before it reaches the substrate surface.

To avoid this undesirable situation, a gradually and continuously expanding gas conduit, according to embodiments of the present invention is believed to reduce the Joule-Thompson effect of gas expansion. An example of gradual expanding gas conduits, 750A, 750B, 750C, and 750D, is shown in FIG. 1 and detailed illustration of the gradual expanding gas conduits, 750A, 750B, 750C, and 750D, are shown in FIG. 3A. The disclosed gas conduit design prevents large temperature drops by allowing the gases to expand gradually and continuously. This is accomplished by gradually and continuously increasing or tapering the flow channel cross-section. In one embodiment, the flow channel transitions from the cross-sections of delivery gas lines with internal diameter of between about 3 mm to about 15 mm to a larger chamber inlet with diameter between about 10 mm to about 20 mm over a distance between about 30 mm to about 100 mm. This gradual increase in flow channel cross-section allows the expanding gases to be in near equilibrium and prevent a rapid temperature drop. The gradually and continuously expanding gas conduit may comprise one or more tapered inner surfaces (shown in FIG. 3B), such as a tapered straight surface, a concave surface, a convex surface, or combinations thereof or may comprise sections of one or more tapered inner surfaces (i.e., a portion tapered and a portion non-tapered). The shapes and sizes of the gas conduits, such as 750A, 750B, 750C, and 750D, do not have to be the same for a process chamber.

Figure 3C:
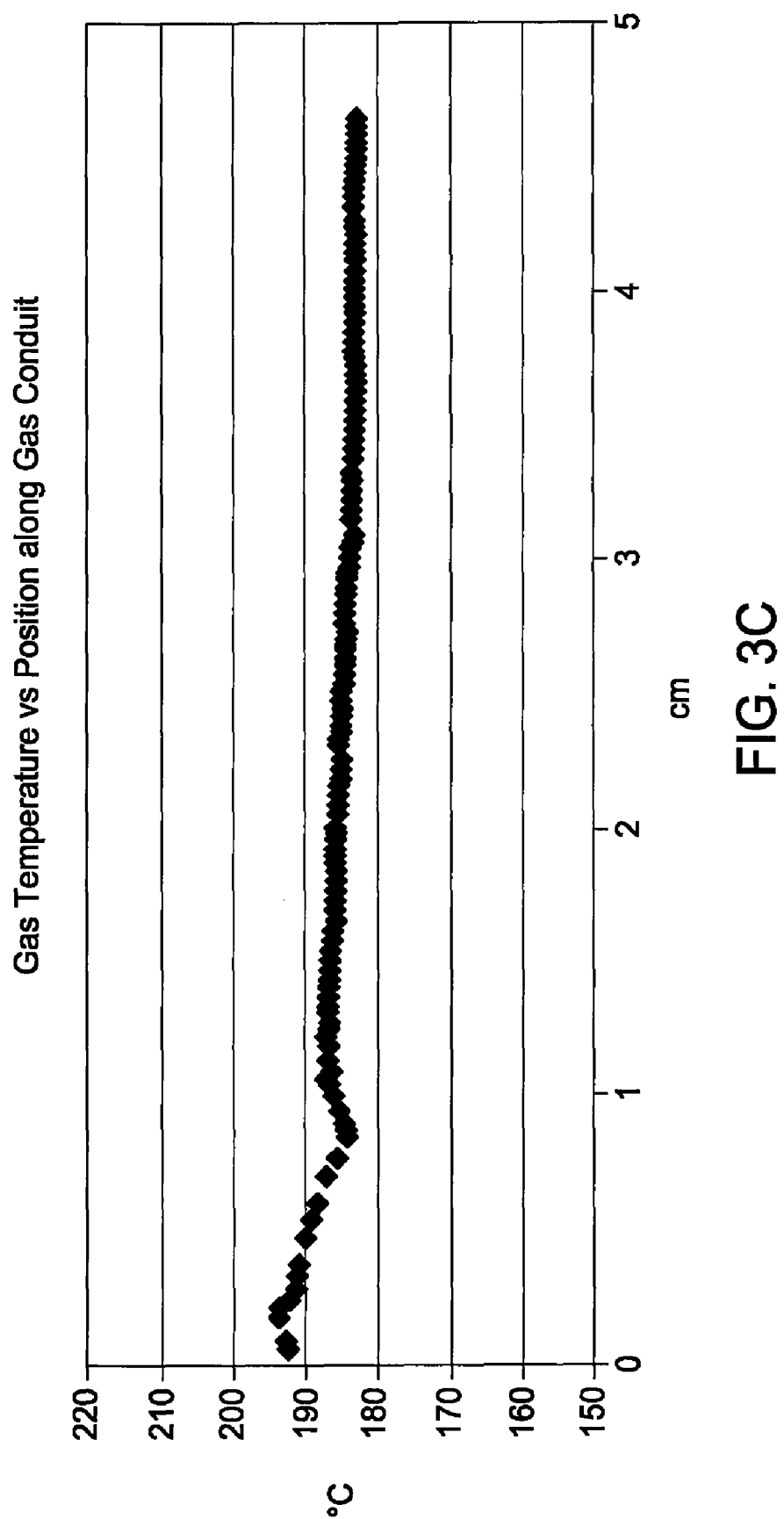
FIG. 3C shows the simulation result of gas temperature along one embodiment of a gas conduit of the current invention.

FIG. 3C shows simulated results of the temperature drop along the about 5 cm tapered gas conduits, 750A, 750B, 750C, and 750D, of FIGS. 1 and 3A. The temperature drops only slightly from 190° C. to 183° C., in contrast to large temperature drop of 200° C. to 108° C. of the conventional design as shown in FIG. 4. Gas conduit temperature maintaining above 180° C. helps to keep the hafnium precursor in vapor form. As evidenced by computer simulations data, the gas flow in the gas conduit design with tapered flow channels experiences a smaller temperature drop.

Figure 4A:
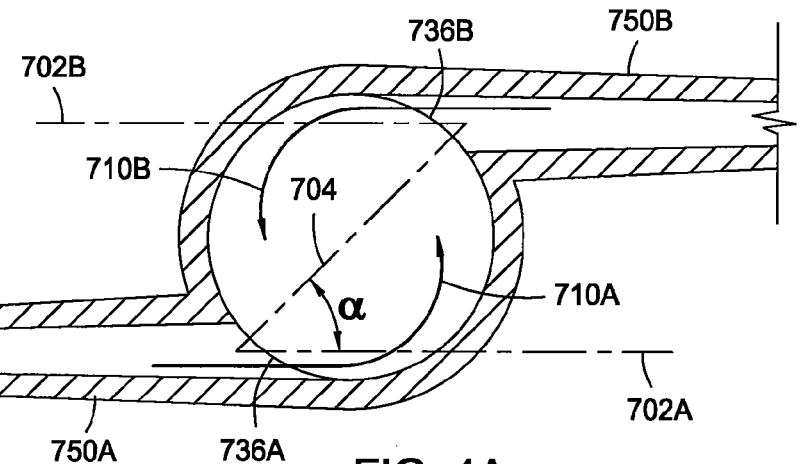
FIG. 4A depicts a schematic top cross-sectional view of one embodiment of the expanding channel of the chamber of FIG. 1.

FIG. 4A is a top cross-sectional view of one embodiment of the expanding section 734 of the chamber lid 732 of FIG. 1. Each gas conduit, such as 750A, 750B, may be positioned at an angle α from the center lines 702A, 702B of the gas conduit, such as 750A, 750B, and from a radius line 704 from the center of the expanding channel 734. Entry of a gas through the gas conduit 750A, 750B preferably positioned at an angle α (i.e., when α>0°) causes the gas to flow in a circular direction as shown by arrow 710A (or 710B). Providing gas at an angle α as opposed to directly straight-on to the walls of the expanding channel (i.e. when α=0°) helps to provide a more laminar flow through the expanding channel 734 rather than a turbulent flow. It is believed that a laminar flow through the expanding channel 734 results in an improved purging of the inner surface of the expanding channel 734 and other surfaces of the chamber lid 732. In comparison, a turbulent flow may not uniformly flow across the inner surface of the expanding channel 734 and other surfaces and may contain dead spots or stagnant spots in which there is no gas flow. In one aspect, the gas conduits, such as 750A, 750B, and the corresponding gas inlets 736A, 736B are spaced out from each other and direct a flow in the same circular direction (i.e., clockwise or counter-clockwise). Gas conduits, 750C and 750D, can be placed below gas conduits, 750A and 750B, respectively along the expanding channel 734, or be placed next to gas conduits 750A, 750B and be on the plane level as the gas conduits 750A, 750B.

Figure 4B:
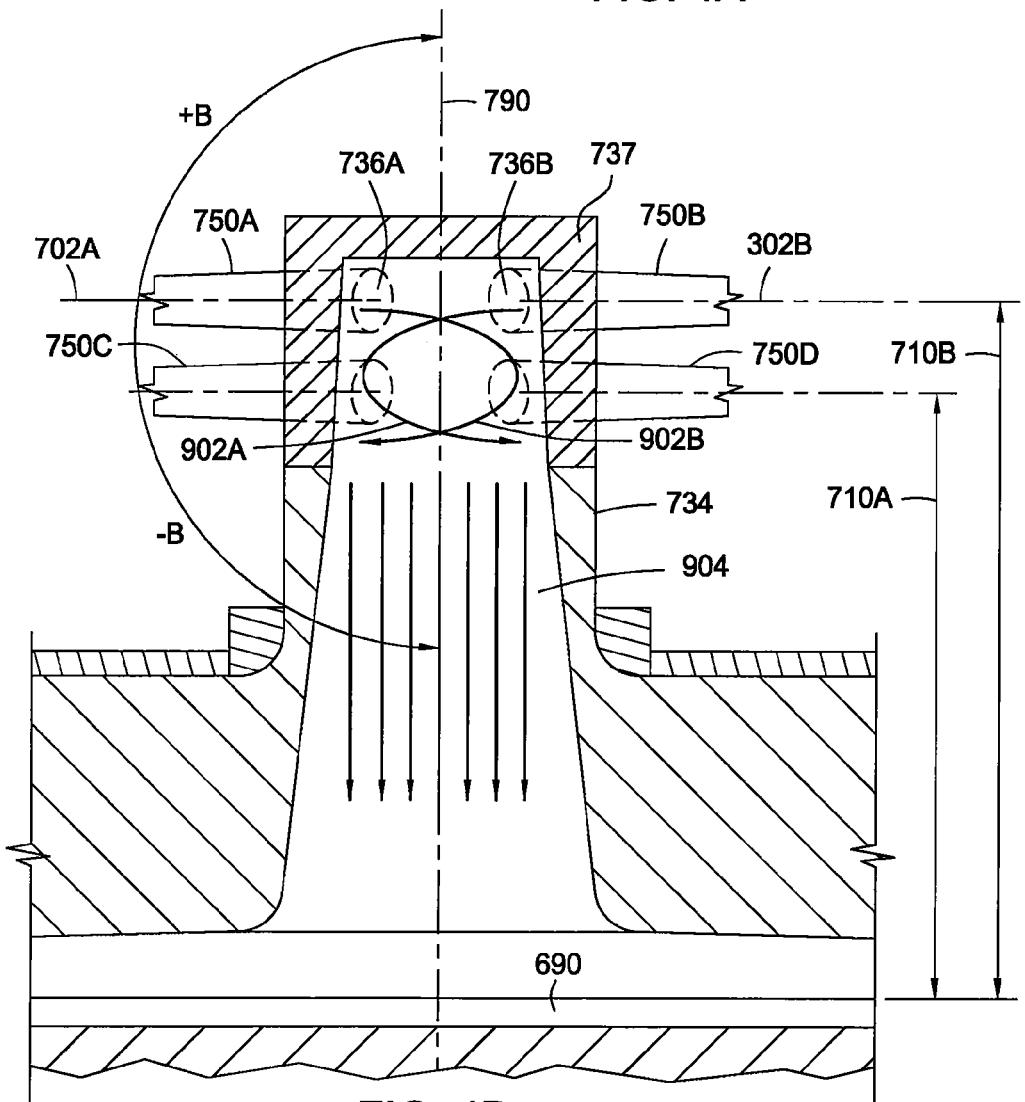
FIG. 4B depicts a schematic cross-sectional view of the expanding channel of the chamber lid of FIG. 1.

Not wishing to be bound by theory, FIG. 4B is a cross-sectional view of the expanding channel 734 of a chamber lid 732 showing simplified representations of two gas flows therethrough. Although the exact flow pattern through the expanding channel 734 is not known, it is believed that the circular flow 710 (FIG. 4B) may travel as a "vortex," "helix," or "spiral" flow 902A, 902B through the expanding channel 734 as shown by arrows 902A, 902B. As shown in FIG. 3C, the circular flow may be provided in a "processing region" as opposed to in a compartment separated from the substrate 690. In one aspect, the vortex flow may help to establish a more efficient purge of the expanding channel 734 due to the sweeping action of the vortex flow pattern across the inner surface of the expanding channel 734.

In one embodiment, the distance 710A between the gas inlets 736A, 736B and the substrate 690 is made far enough that the "vortex" flow 902 dissipates to a downwardly flow as shown by arrows 904 as a spiral flow across the surface of the substrate 690 may not be desirable. It is believed that the "vortex" flow 902 and the downwardly flow 904 proceeds in a laminar manner efficiently purging the chamber lid 732 and the substrate 690. In one specific embodiment the distance 710A, 710B between the upper portion 737 of the expanding channel 734 and the substrate 690 is about 1.0 inches or more, more preferably about 2.0 inches or more. In one specific embodiment, the upper limit of the distance 710A, 710B is dictated by practical limitations. For example, if the distance 710A, 710B is very long, then the residence time of a gas traveling though the expanding channel 734 would be long, then the time for a gas to deposit onto the substrate would be long, and then throughput would be low. In addition, if distance 710A, 710B is very long, manufacturing of the expanding channel 734 would be difficult. In general, the upper limit of distance 710A, 710B may be 3 inches or more for a chamber adapted to process 200 mm diameter substrates or 5 inches or more for a chamber adapted to process 300 mm diameter substrates.

Referring to FIG. 1, at least a portion of the bottom surface 760 of the chamber lid 732 may be tapered from the expanding channel 734 to a peripheral portion of the chamber lid 732 to help provide an improved velocity profile of a gas flow from the expanding channel 734 across the surface of the substrate 690 (i.e., from the center of the substrate to the edge of the substrate). The bottom surface 760 may comprise one or more tapered surfaces, such as a straight surface, a concave surface, a convex surface, or combinations thereof. In one embodiment, the bottom surface 760 is tapered in the shape of a funnel.

In the existing ALD reactor design, when the process exhaust gas exits the expanding channel 734, it comes in contact of the reactor inner sidewall 684 and also can escape to the region below the substrate support 692. When the process exhaust gas, such as gas containing hafnium precursor and gas containing water vapor, comes in contact with the reactor inner sidewall 684 and the region below the substrate support 692, it could result in $H_2O$ vapor condensation due to lower surface temperature of these areas. The condensed $H_2O$ reacts with hafnium precursors to form particles and causes serious particle problems. In addition, once the process exhaust gas escapes to the region below the substrate support 692, it is difficult and very time consuming to pump on the exhaust gas.

Figure 5A:
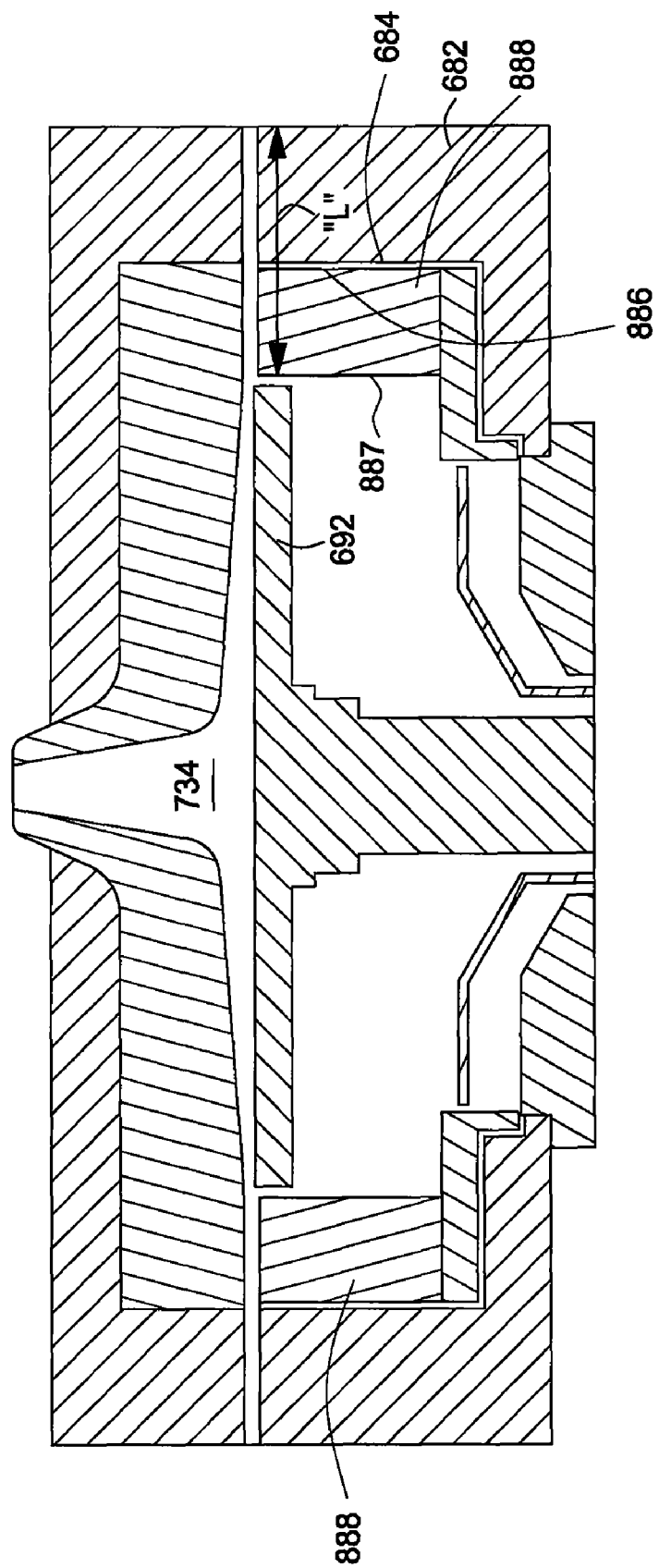
FIG. 5A illustrates a schematic view of the process chamber with a liner between the substrate support and the chamber sidewall.

One way to resolve these issues is to provide a gas liner that is leveled at exhausting ports level or above the wafer processing plane so that the process exhaust gas does not experience a lower surface temperature until it is ready to exit the reactor 680 and also the exiting process gas does not escape to the backside of the substrate support 692. FIG. 5A shows a schematic drawing of an ALD chamber with a gas liner 888. The gas liner 888 is close to the pedestal 692 to take more heat from the pedestal. This would keep the gas liner 888 at elevated temperature, preferably above 100° C., to prevent water vapor from condensing into liquid form at the liner. The liner is leveled with the substrate support during process exhaust gas being pumped out and also fill most of the space between the substrate support 692 and the chamber sidewall 684; therefore, the gas liner 888 prevents the process exhaust gas from escaping to the region below the substrate support 692 and prevents process exhaust gas from create back side deposition on the pedestal 692.

The liner 888 is ring-shaped and it fits between the substrate support and the chamber wall. The liner's inside wall 887 should be very close to the pedestal 692 to take heat from the pedestal heater via convention, conduction and radiation heat transfer. This would make the temperature of the liner to be at desired temperature of about 100° C. In one embodiment, the distance between the liner's inside wall 887 to the pedestal (or substrate support) 692 is between about 0.1 inch (or 0.25 cm) to about 0.5 inch (or 1.27 cm). When the liner 888 is at this elevated temperature of about 100° C., the water vapor will not condense on the liner's wall. The liner's outside wall 886 should also be very close to the chamber inner wall 684 to prevent process exhaust gas from escaping to the backside of the pedestal 692. In one embodiment, the distance between the liner's outside wall 886 to the chamber inner wall 684 is between about 0.1 inch (or 0.25 cm) to about 0.5 inch (or 1.27 cm).

Figure 5B:
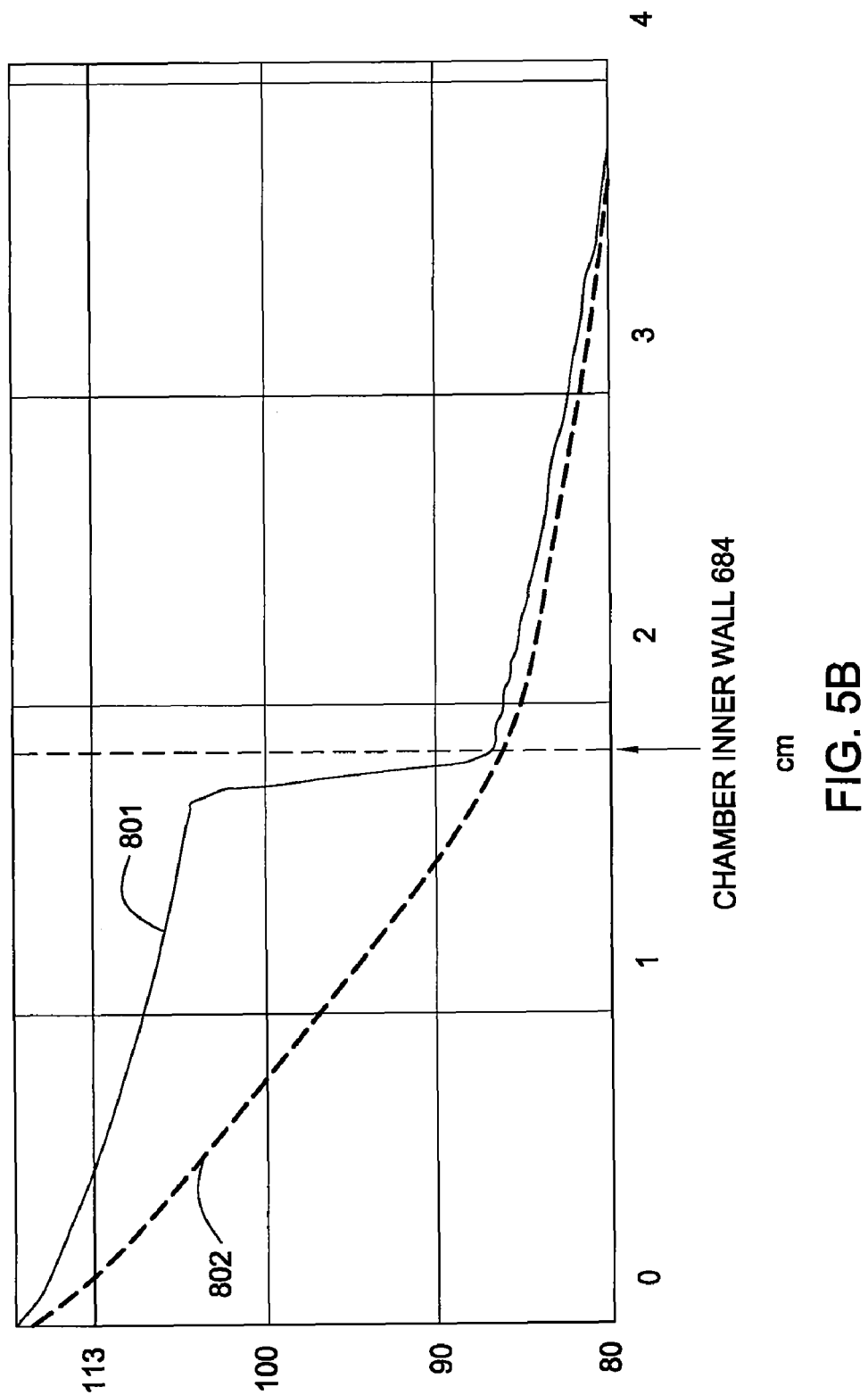
FIG. 5B shows the simulation results of temperature along line "L" in the process chamber of FIG. 6 with and without the liner.
Figure 5C:
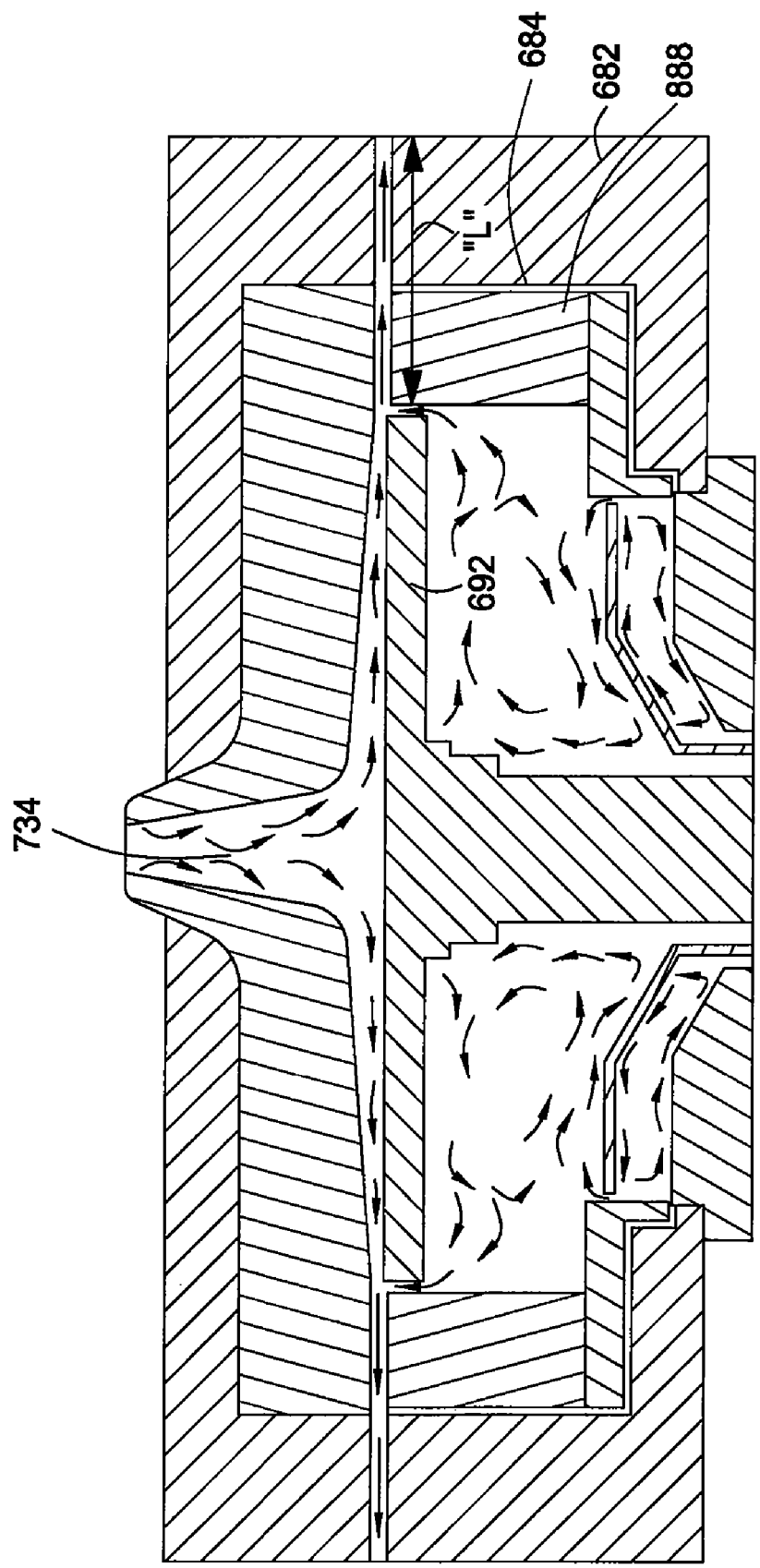
FIG. 5C shows the flow dynamic simulation of gas flow of process exhaust gas and purge gas in the process chamber.

FIG. 8 shows the temperature simulation results of along line "L" of reactors between the substrate support 692 and the part of chamber wall 684 of FIG. 5A. Curve 801 shows the simulated temperature with the liner 888, while curve 802 shows the simulated temperature without the liner 888. The temperature of chamber wall 684 is about 85° C. with or without liner. However, liner maintains the temperature at above 105° C., until it reaches the chamber wall 684. This helps to keep the water vapor in gas form. FIG. 5B shows a flow modeling on the design to predict the effectiveness of the design. The flow simulation that gas(es) would be pumped out before reaching the back of the pedestal heater. CFD-ACE+ computation fluid dynamics software is used to perform the flow simulation. The flow simulation shows that the process gas mainly is exhausted without escaping to the backside of the substrate support 692. The flow simulation also shows that bottom purge gas circulates in the region below the backside of the substrate support 692 before being pumped out. The bottom purge gas creates a relative high pressure region to prevent process gas from reaching the backside of the substrate support 692, or the heater.

The materials for the liner 888 depends on the nature of the process gases. The liner 888 can be made of materials such as aluminum, if the process gas is non-corrosive, such as TDEAH. The liner 888 can also be made of corrosion-resistant materials, such as quartz or pyrolytic boron nitride, if the process gas is corrosive, such as $HfCl_4$.

The existing design of the gas delivery has limitation on how much reactive precursor can be delivered to the process chamber in a short amount of time. Advanced ALD process requires the precursor to be delivered to the process chamber in a short time, such as between about 50 ms to about 3 seconds to ensure high substrate processing throughput, and under stable and repeatable temperature to minimize temperature fluctuation and to ensure low particle counts. For the existing gas delivery, when the gas valve, such as 742A, 742B, 742C and 742D, is first opened, the process gas would burst into the process chamber and cause the gas pressure in the gas conduit, such as 750A, 750B, 750C, and 750D, to drop quickly. It takes time for the gas conduit, such as 750A, 750B, 750C, and 750D, to replenish process gas and to recover pressure in the gas conduit. For ALD processing, the precise control of pressure in the gas conduit(s) and amount of process gas delivered is very important. Since the pulsing of the process gas, such as hafnium precursor gas, could only take 2 seconds or below, the time it take to recover pressure in the gas conduit makes the precise control of advanced ALD processing impossible.

Figure 6A:
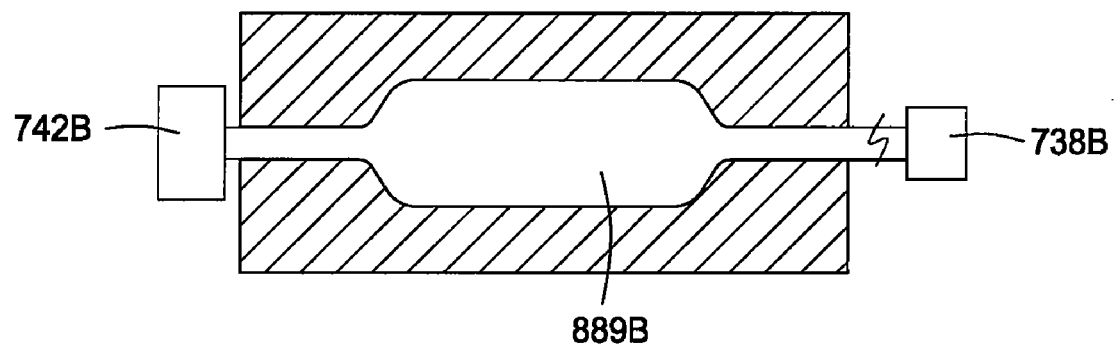
FIG. 6A depicts a schematic drawing of two examples of gas reservoirs of the current invention.
Figure 6A:
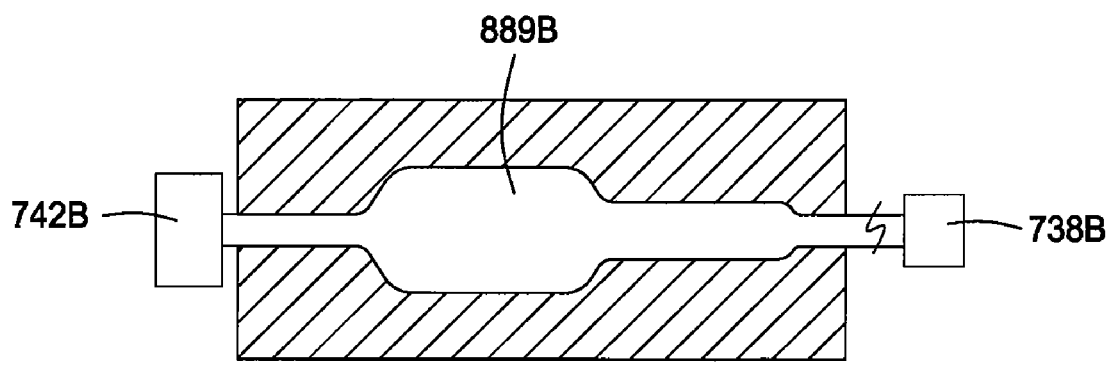
Figure 6B:
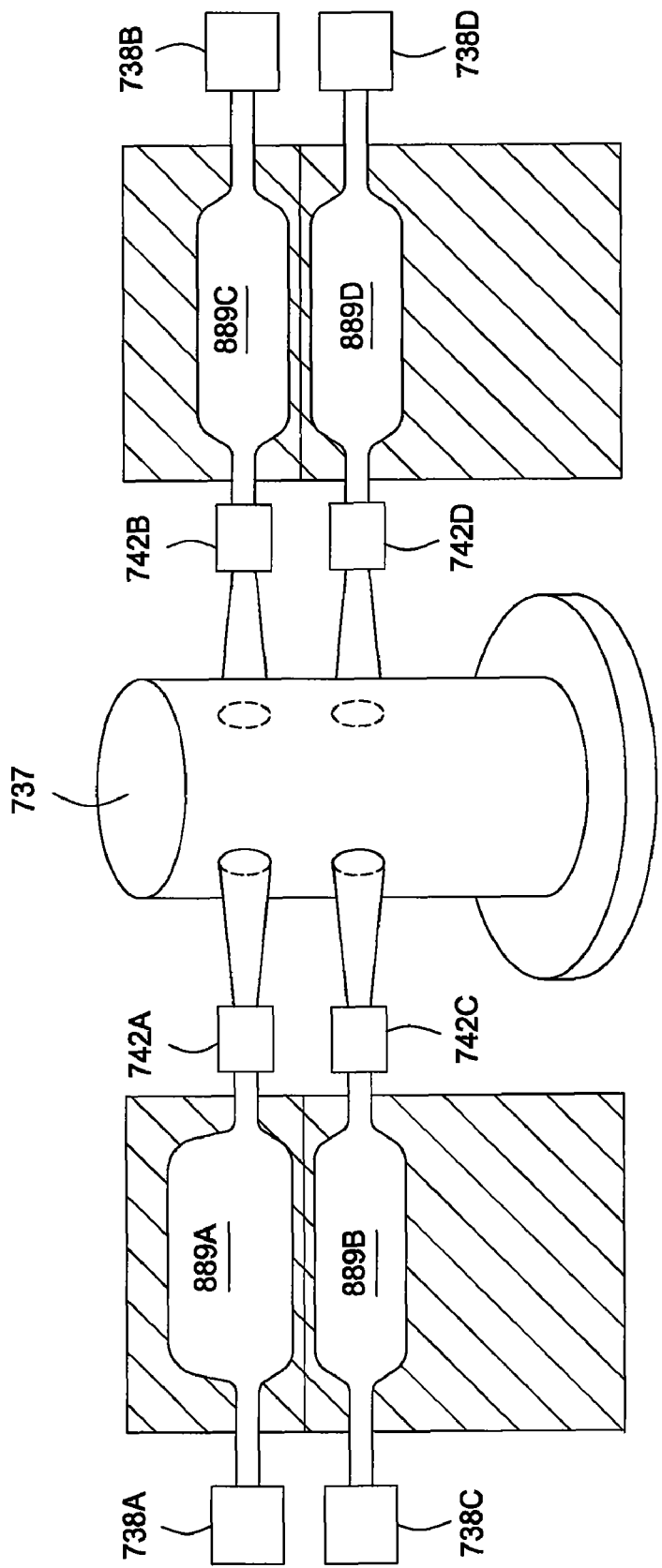
FIG. 6B depicts a schematic drawing of exemplary gas reservoirs connected to the expanding gas conduits of the current invention.

A process gas reservoir located close to the point of use that allows for a higher concentration of precursor to be delivered to the chamber in a shorter amount of time and helps to reduce the pressure drop when the process gas is introduced into the chamber can be used. FIG. 6A shows the two exemplary designs (A and B) of a reservoir 889B, which is coupled to the valves 742B and gas source 738B. In one embodiment, the reservoir 889B has a large volume between about 80 cc to about 200 cc to store reactive precursor gas, which could be introduced at a higher amount during process. The gas reservoir 889 is also designed to have gradual increased diameters at two ends to reduce the Joule-Thompson effect mentioned above. The gradual increased diameters at the two ends of the reservoir allows for even temperature distribution across the reservoir at all time. The reservoir 889B was designed to allow for a higher volume of the precursor closer to the point of use. The outlet of the gas reservoir 889B, or the end that is connected a valve 742B that couples to a gas conduit 750B (not shown here) to the process chamber, should be at the same level as the gas conduit 750B to avoid needing to bend the gas line. Bending the gas line at an angle, such as 90 degree, could cause the gas velocity to drop and could result in change of gas temperature. The gas reservoirs 889A, 889B, 889C, 889D can be coupled to one of the gas conduits 750A, 750B, 750C, 750D which is attached to gas inlets 736A, 736B, 736C, 736D to reduce the Joule-Thompson effect of gas expansion when the process gas is introduced into the expanding channel 734, as shown in FIG. 6B.

In one embodiment, the reservoir is made by drilling out the desired shape out of an aluminum bulk on the lid of the chamber to allow for even thermal distribution. Heating materials can be buried in the aluminum bulk to keep the temperature of the gas reservoir constant. The reservoir can be made of other types of conductive materials to allow sufficient heat transfer to maintain the gas temperature. The reservoir can also be made of sheet of conductive material, such as aluminum sheet, and be wrapped with heating medium to control temperature in the reservoir.

In FIG. 1, a control unit 780, such as a programmed personal computer, work station computer, or the like, may be coupled to the process chamber 680 to control processing conditions. For example, the control unit 780 may be configured to control flow of various process gases and purge gases from gas sources 738A, 738B, 738C, 738D, 740 through the valves 742A, 742B, 742C, 742D, 746A, 746B, 746C, 746D during different stages of a substrate process sequence. Illustratively, the control unit 780 comprises a central processing unit (CPU) 782, support circuitry 784, and memory 786 containing associated control software 783.

Figure 7:
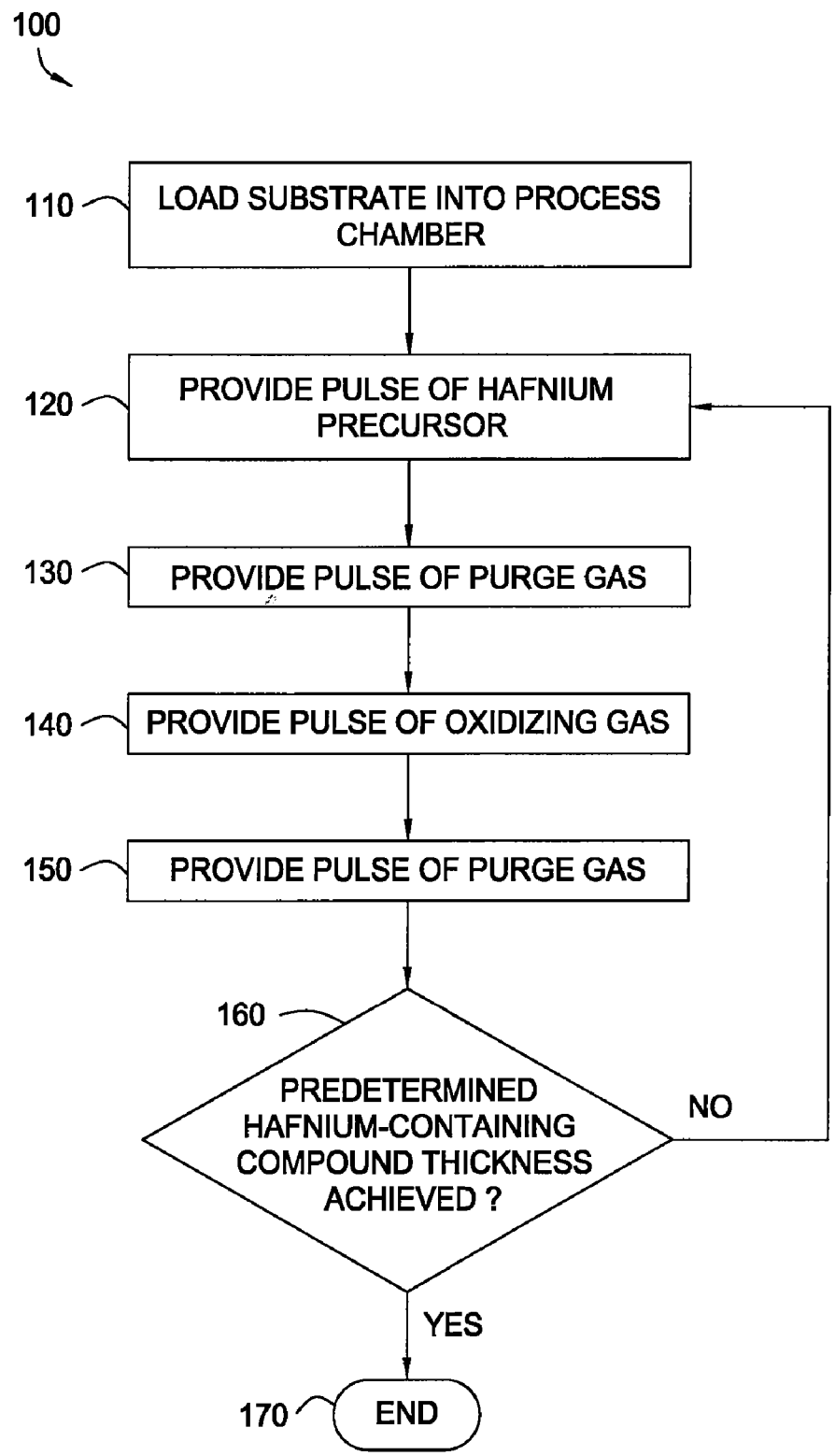
FIG. 7 illustrates a process sequence for a hafnium-containing compound using an ALD technique.

FIG. 7 illustrates an exemplary process sequence 100 for forming a hafnium-containing material, such as hafnium oxide, according to one embodiment of the present invention. A substrate to be processed is first loaded into a process chamber capable of performing cyclical deposition and the process conditions are adjusted (step 110). Process conditions may include temperature, pressure and flow rate of carrier gas. The substrate is then exposed to pulse of a hafnium precursor that is introduced into the process chamber for a time period in a range from about 0.1 second to about 5 seconds (step 120). A pulse of purge gas is then pulsed into the processing chamber (step 130) to purge or otherwise remove any residual hafnium precursor or by-products. Next, a pulse of oxidizing gas is introduced into the processing chamber (step 140). The oxidizing gas may include several oxidizing agents, such as in-situ water and oxygen. A pulse of purge gas is then introduced into the processing chamber (step 150) to purge or otherwise remove any residual oxidizing gas or by-products. Suitable carrier gases or purge gases may include helium, argon, nitrogen, hydrogen, forming gas, oxygen and combinations thereof. A "pulse" as used herein is intended to refer to a quantity of a particular compound that is intermittently or non-continuously introduced into a reaction zone of a processing chamber.

Referring to step 160, after each deposition cycle (steps 120 through 150), a hafnium-containing compound, such as hafnium oxide, having a particular thickness will be deposited on the substrate surface. Usually, each deposition cycle forms a layer with a thickness in the range from about 1 Å to about 10 Å. Depending on specific device requirements, subsequent deposition cycles may be needed to deposit hafnium-containing compound having a desired thickness. As such, a deposition cycle (steps 120 through 150) can be repeated until the desired thickness for the hafnium-containing compound is achieved. Thereafter, the process is stopped as indicated by step 170 when the desired thickness is achieved. Hafnium oxide deposited by an ALD process has the empirical chemical formula $HfO_x$. Hafnium oxide has the molecular chemical formula $HfO_2$, but by varying process conditions (e.g., timing, temperature, precursors), hafnium oxide may not be fully oxidized, such as $HfO_{1.8}$. Preferably, hafnium oxide is deposited by the processes herein with the molecular chemical formula of about $HfO_2$ or less.

The cyclical deposition process or ALD process of FIG. 1 typically occurs at a pressure in the range from about 1 Torr to about 100 Torr, preferably in the range from about 1 Torr to about 20 Torr, for example from about 1 Torr to about 10 Torr. The temperature of the substrate is usually in the range from about 70° C. to about 1,000° C., preferably from about 100° C. to about 650° C., more preferably from about 250° C. to about 500° C.

In step 120, the hafnium precursor is introduced to the process chamber at a rate in the range from about 5 mg/m to about 200 mg/m. The hafnium precursor is usually introduced with a carrier gas, such as nitrogen, with a total flow rate in the range from about 50 sccm to about 2,000 sccm. In conventional ALD processes, the hafnium precursor is pulsed into the process chamber at a duration from about 1 second to about 10 seconds, depending on the particular process and desired hafnium-containing compound. In advanced ALD processes, the hafnium precursor is pulsed into the process chamber at a shorter duration from about 50 ms to about 3 seconds. In one embodiment, the hafnium precursor is preferably hafnium tetrachloride ($HfCl_4$). In another embodiment, the hafnium precursor is preferably tetrakis(diethylamine)hafnium (($Et_2N)_4Hf$ or TDEAH).

The hafnium precursor is generally dispensed to the process chamber by introducing carrier gas into a bubbler containing the hafnium precursor. Suitable bubblers, such as PROE-VAP™, are available from Advanced Technology Materials, Inc., locate in Danbury, Conn. The temperature of the bubbler is maintained at a temperature depending on the hafnium precursor within, such as from about 100° C. to about 300° C. For example, the bubbler may contain $HfCl_4$ at a temperature from about 150° C. to about 200° C.

In step 140, the oxidizing gas is introduced to the process chamber at a rate in the range from about 10 sccm to about 1,000 sccm, preferably in the range from about 30 sccm to about 200 sccm. For conventional ALD processes, the oxidizing gas is pulsed into the process chamber at a rate from about 0.1 second to about 10 seconds, depending on the particular process and desired hafnium-containing compound. In advanced ALD processes, the oxidizing gas is pulsed into the process chamber at a shorter duration from about 50 ms to about 3 seconds.

In one embodiment, the oxidizing gas is produced from a water vapor generating (WVG) system that is in fluid communication to the process chamber by a line. The WVG system generates ultra-high purity water vapor by means of a catalytic reaction of $O_2$ and $H_2$. The WVG system has a catalyst-lined reactor or a catalyst cartridge in which water vapor is generated by means of a chemical reaction, unlike pyrogenic generators that produce water vapor as a result of ignition. Regulating the flow of $H_2$ and $O_2$ allows the concentration to be precisely controlled at any point from 1% to 100% concentrations. The water vapor may contain water, $H_2$, $O_2$ and combinations thereof. Suitable WVG systems are commercially available, such as the WVG by Fujikin of America, Inc., located in Santa Clara, Calif. and the CSGS (Catalyst Steam Generator System) by Ultra Clean Technology, located in Menlo Park, Calif.

The pulses of a purge gas, preferably argon or nitrogen, at steps 130 and 150, are typically introduced at a rate between about 1 slm to about 20 slm, preferably at a rate between about 2 slm to about 6 slm. Each processing cycle (steps 120 through 150) lasts from about 0.01 seconds to about 20 seconds. For example, in one embodiment, the processing cycle is about 10 seconds, while in another embodiment, the processing cycle is about 2 seconds. Longer processing steps lasting about 10 seconds deposit excellent hafnium-containing films, but the throughput is reduced. The specific pressures and times are obtained through experimentation.

Many precursors are within the scope of the invention. One important precursor characteristic is to have a favorable vapor pressure. Precursors at ambient temperature and pressure may be gas, liquid or solid. However, within the ALD chamber, volatilized precursors are utilized. Organometallic compounds or complexes include any chemical containing a metal and at least one organic group, such as amides, alkyls, alkoxyls, alkylamidos and anilides. Precursors comprise of organometallic, inorganic and halide compounds.

An exemplary ALD process is a hafnium oxide film grown by sequentially pulsing a hafnium precursor with in-situ steam formed from a water generator. A substrate surface is exposed to a pretreatment to form hydroxyl groups. The hafnium precursor, $HfCl_4$, is maintained in a precursor bubbler at a temperature from about 150° C. to about 200° C. Carrier gas, such as nitrogen, is directed into the bubbler with a flow rate of about 400 sccm. The hafnium precursor saturates the carrier gas and is pulsed into the chamber for 3 seconds. A purge gas of nitrogen is pulsed into the chamber for 3 seconds to remove any unbound hafnium precursor. Hydrogen gas and oxygen gas with the flow rate of 120 sccm and 60 sccm respectively, are supplied to a water vapor generator (WVG) system. The in-situ steam exits from the WVG with approximately 60 sccm of water vapor. The in-situ steam is pulsed into the chamber for 1.7 seconds. The purge gas of nitrogen is pulsed into the chamber for 4 seconds to remove any unbound or non-reacted reagents, such as byproducts, hafnium precursor, oxygen and/or water or any by-products such as HCl. The temperature of the substrate is maintained at a temperature between about 400° C. to about 600° C. Each ALD cycle forms about 0.8 Å of a hafnium oxide film.

Although the embodiments of the invention are described to deposit hafnium-containing compounds, a variety of metal oxides and/or metal silicates may be formed outside of the hafnium-containing compounds by alternately pulsing metal precursors with oxidizing gas derived from a WVG system, such as a fluid of water vapor and $O_2$. The ALD processes disclosed above may be altered by substituting the hafnium and/or silicon precursors with other metal precursors to form materials, such as hafnium aluminates, titanium silicates, zirconium oxides, zirconium silicates, zirconium aluminates, tantalum oxides, tantalum silicates, titanium oxides, titanium silicates, silicon oxides, aluminum oxides, aluminum silicates, lanthanum oxides, lanthanum silicates, lanthanum aluminates, nitrides thereof, and combinations thereof.

While the foregoing is directed to embodiments of the present invention, other and further embodiments of the invention may be devised without departing from the basic scope thereof, and the scope thereof is determined by the claims that follow.

The invention claimed is:

1. An atomic layer deposition process chamber, comprising:
   a gas delivery assembly, comprising:
      a covering member;
      an expanding channel disposed at a central portion of the covering member, the expanding channel comprising a bottom surface extending from the expanding channel to a peripheral portion of the covering member;
      a gas conduit having a first end, with a first diameter, connected to a gas inlet of the expanding channel, and a second end, with a second diameter, connected to a gas valve; and
      a gas reservoir having a first end and a second end, wherein a diameter of the first end of the gas reservoir is gradually and continuously reduced to a diameter of the gas valve that connects to the gas conduit and a diameter of the second end of the gas reservoir is gradually and continuously reduced to a diameter of a gas line that connects to a gas source; and
   a substrate support disposed below the covering member.

2. The chamber of claim 1, wherein the gas conduit is disposed normal to a longitudinal axis of the expanding channel.

3. The chamber of claim 1, wherein the expanding channel comprises a tapered surface extending from the central portion of the covering member to the peripheral portion of the covering member.

4. The chamber of claim 1, wherein there are four gas conduits equally spaced around a perimeter of the expanding channel.

5. The chamber of claim 1, wherein the first diameter of the gas conduit is greater than the second diameter of the gas conduit.

6. The chamber of claim 5, wherein the diameter of the gas conduit is gradually and continuously increased from the second diameter to the first diameter.

7. The chamber of claim 1, wherein the gas conduit is positioned at an angle from a center line of the expanding channel.

8. The chamber of claim 1, wherein the first end of the gas reservoir is at the same level as the gas conduit.

9. The chamber of claim 1, wherein the gas reservoir has a volume between about 80 cc to about 200 cc.

10. The chamber of claim 1, wherein the gas reservoir is formed by drilling out of a bulk body.

11. The chamber of claim 10, wherein the bulk body is made of thermal conductive materials.

12. The chamber of claim 11, wherein the thermal conductive materials is aluminum.

13. The chamber of claim 10, wherein the bulk body further comprises a heating medium buried therein.

14. The chamber of claim 10, wherein the bulk body is an aluminum sheet wrapped with a heating medium.

* * * * *